US012347786B2

(12) United States Patent
Lee et al.

(10) Patent No.: US 12,347,786 B2
(45) Date of Patent: Jul. 1, 2025

(54) DISPLAY DEVICE INCLUDING A PANEL ALIGNMENT MARK

(71) Applicant: SAMSUNG DISPLAY CO., LTD., Yongin-si (KR)

(72) Inventors: Chung Seok Lee, Hwaseong-si (KR); Jeong Eun Park, Goyang-si (KR); Han Ho Park, Yongin-si (KR); Jeong Min Ban, Cheonan-si (KR); Joong Mok Lee, Suwon-si (KR); So Yeon Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 619 days.

(21) Appl. No.: 17/659,065

(22) Filed: Apr. 13, 2022

(65) Prior Publication Data

US 2022/0336369 A1   Oct. 20, 2022

(30) Foreign Application Priority Data

Apr. 15, 2021   (KR) .................. 10-2021-0049146

(51) Int. Cl.
| | |
|---|---|
| *G06F 1/16* | (2006.01) |
| *H01L 23/544* | (2006.01) |
| *H05K 5/00* | (2025.01) |
| *H05K 7/00* | (2006.01) |
| *H10D 86/40* | (2025.01) |
| *H10D 86/60* | (2025.01) |
| *G06F 1/18* | (2006.01) |

(52) U.S. Cl.
CPC ......... *H01L 23/544* (2013.01); *H10D 86/441* (2025.01); *H10D 86/60* (2025.01); *G06F 1/189* (2013.01); *H01L 2223/54426* (2013.01)

(58) Field of Classification Search
CPC ...... H01L 23/544; H01L 27/124; G06F 1/189
See application file for complete search history.

(56) References Cited

U.S. PATENT DOCUMENTS

| | | | | |
|---|---|---|---|---|
| 10,651,260 | B2 * | 5/2020 | Lee ...................... | H05K 1/0271 |
| 2019/0067406 | A1 * | 2/2019 | Lee ...................... | H01L 27/1262 |
| 2021/0066434 | A1 * | 3/2021 | Lee ...................... | H10K 59/131 |
| 2021/0066828 | A1 * | 3/2021 | Woo ......................... | G02F 1/00 |
| 2021/0313411 | A1 * | 10/2021 | Jung ................... | G02F 1/13458 |
| 2021/0351262 | A1 * | 11/2021 | Kim ....................... | H10K 59/88 |
| 2022/0005915 | A1 * | 1/2022 | Kim ................... | G02F 1/13454 |
| 2022/0085120 | A1 * | 3/2022 | Lee ...................... | H10K 59/131 |
| 2023/0176614 | A1 * | 6/2023 | Kim ....................... | G06F 1/1624 |

FOREIGN PATENT DOCUMENTS

| | | |
|---|---|---|
| KR | 10-2004-0031642 | 4/2004 |
| KR | 10-2013-008150 | 7/2013 |
| KR | 10-2018-0027693 | 3/2018 |
| KR | 10-2019-0021525 | 3/2019 |
| KR | 10-2020-0018749 | 2/2020 |

\* cited by examiner

*Primary Examiner* — Anthony M Haughton
(74) *Attorney, Agent, or Firm* — F. CHAU & ASSOCIATES, LLC

(57) ABSTRACT

A display device includes a display panel including a plurality of panel pads, and a panel alignment mark adjacent to the plurality of panel pads. A connection circuit board is connected to the display panel. The connection circuit board includes a plurality of input/output pads and a plurality of dummy pads adjacent to the plurality of input/output pads. Some of the plurality of dummy pads overlap the panel alignment mark in a thickness direction of the display device.

26 Claims, 14 Drawing Sheets

DISPLAY DEVICE INCLUDING A PANEL ALIGNMENT MARK

CROSS-REFERENCE TO RELATED APPLICATION

This application claims priority under 35 U.S.C. § 119 to Korean Patent Application No. 10-2021-0049146 filed on Apr. 15, 2021 in the Korean Intellectual Property Office, the contents of which are herein incorporated by reference in their entirety.

TECHNICAL FIELD

The present disclosure relates to a display device and, more particularly, to a display device including a panel alignment mark.

DISCUSSION OF THE RELATED ART

The importance of display devices is increasing with the proliferation of multimedia. In response to this trend, various types of display devices such as a liquid crystal display (LCD) device, and an organic light-emitting diode (OLED) display device have been used.

A connection circuit board that connects a display panel of a display device and a main circuit board to each other may be electrically connected to the panel and the main circuit board via connection pads. An adhesive, such as an anisotropic conductive film, may be interposed between the printed circuit board and the display panel. The printed circuit board may be bonded to the display panel using a thermocompression tool or the like to cure the adhesive.

SUMMARY

A display device includes a display panel including a plurality of panel pads, and a panel alignment mark adjacent to the plurality of panel pads. A connection circuit board is connected to the display panel. The connection circuit board includes a plurality of pads, and a plurality of dummy pads adjacent to the plurality of pads. Some of the plurality of dummy pads at least partially overlap the panel alignment mark in a thickness direction of the display device.

A display device includes a connection circuit board including a plurality of first dummy pads, and a plurality of second dummy pads. Each second dummy pad extends in parallel with the plurality of first dummy pads, and has a length that is smaller than a length of each of the plurality of first dummy pads. A panel alignment mark overlaps the plurality of first dummy pads in a thickness direction of the display device.

A display device includes a display panel including a panel alignment mark and a connection circuit board connected to the display panel including a plurality of connection pads and a plurality of dummy pads. At least one connection pad of the plurality of connection pads overlaps the panel alignment mark.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTIONS

Figure 1:
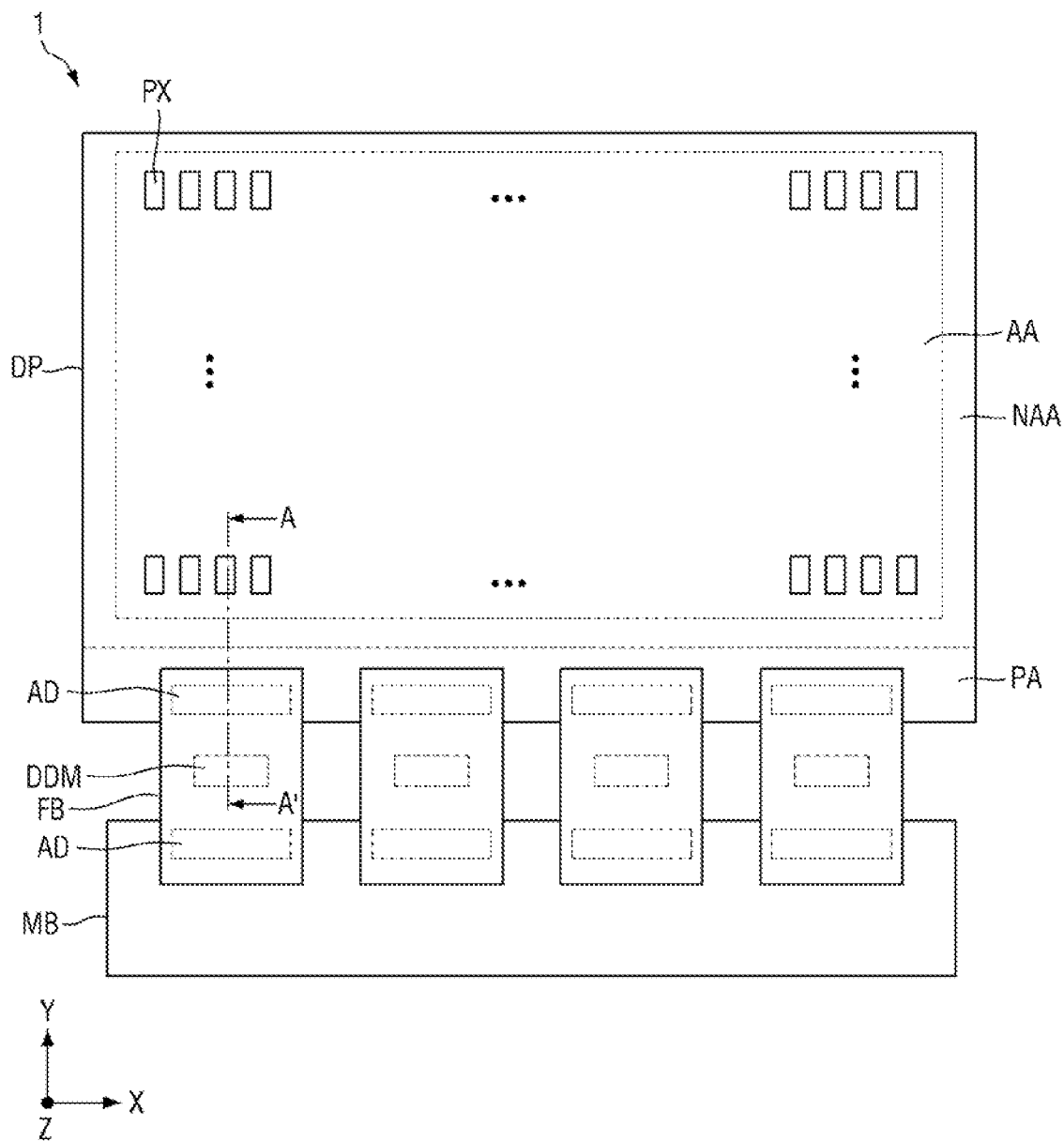
FIG. 1 is a plan view of a display device according to an implementation of the present disclosure.

Aspects and features of the present disclosure, and a method of achieving the aspects and features described herein will become apparent with reference to embodiments described herein with reference to the accompanying drawings. However, the present disclosure is not necessarily limited to the embodiments as disclosed below, but may be implemented in various different forms.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first", "second", "third", and so on may be used herein to describe various elements, components, regions, layers and/or sections, these elements, components, regions, layers and/or sections should not necessarily be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Hereinafter, specific implementations of the present disclosure will be described with reference to the accompanying drawings.

Figure 2:
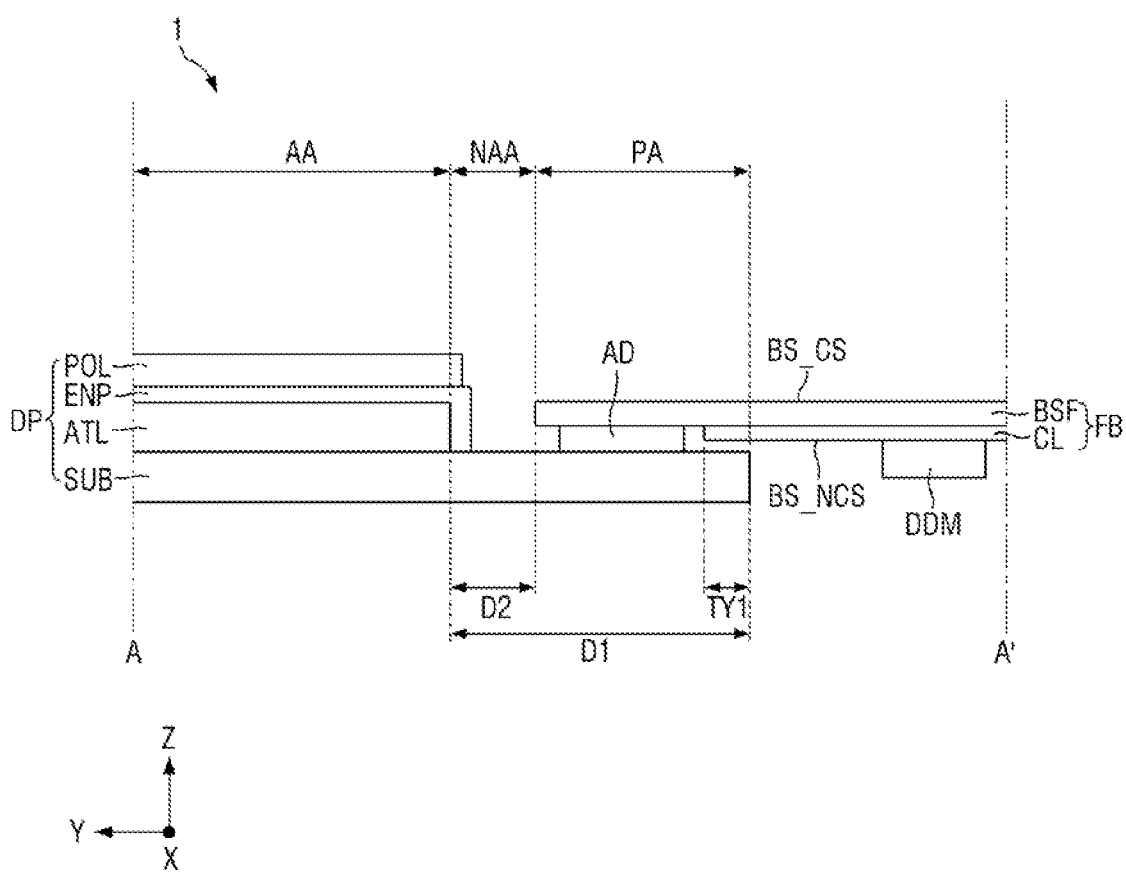
FIG. 2 is a cross-sectional view taken along a line A-A' in FIG. 1.

FIG. 1 is a plan view of a display device according to an implementation of the present disclosure. FIG. 2 is a cross-sectional view taken along a line A-A' in FIG. 1.

Hereinafter, a first direction (X), a second direction (Y) and a third direction (Z) are different directions and intersect each other. In one example, the first direction (X) may refer to a width direction, the second direction (Y) may refer to a length direction, and the third direction (Z) may refer to a height direction or a thickness direction. However, the directions and the name thereof should be construed in a relative manner. The present disclosure is not necessarily limited to the particular example set forth above.

Referring to FIG. 1, a display device 1 displays moving pictures or still images. The display device 1 may be used as a display screen of portable electronic devices such as a mobile phone, a smart phone, a tablet PC (personal computer), a smart watch, a watch phone, a mobile communication terminal, and an electronic notebook, an E-book, a PMP (Portable Multimedia Player), a vehicle or personal navigation device, an UMPC (Ultra Mobile) PC, etc. and various electronic products such as televisions, laptops, monitors, billboards, and IoT devices.

The display device 1 may have an approximate rectangular shape with both long-sides extending in the first direction (X) and both short-sides extending in the second direction (Y) in a plan view. However, the present disclosure is not necessarily limited thereto. The display device 1 may have various planar shapes such as a polygon, a circle, and an ellipse and the display device 1 may even be curved in one or more directions.

The display device 1 may include a display panel DP, a connection circuit board FB, and a main circuit board MB.

The display panel DP may include a light emitting element. For example, the display panel DP may include an organic light-emissive display panel using an organic light-emissive diode (OLED) including an organic light-emissive layer, a micro light-emissive diode display panel using a micro LED, a quantum dot light-emissive display panel using a quantum dot light emitting diode, or an inorganic light-emissive display panel using an inorganic light emission element including an inorganic semiconductor. In one implementation of the present disclosure, the display panel DP may be embodied as the organic light-emissive display panel. However, the present disclosure is not necessarily limited thereto.

The display device 1 may include an active area AA, a non-active area NAA and a pad area PA.

The active area AA may display an image. A plurality of pixels PX for displaying an image may be disposed (e.g., exclusively) within the active area AA. The active area AA may detect an input for recognizing a user's touch input, a fingerprint pattern, and a pen input. The active area AA may include a plurality of sensors that sense a touch input, a fingerprint pattern, and a pen input. The active area AA may have, for example, a rectangular planar shape. However, the present disclosure is not necessarily limited thereto.

The non-active area NAA may be disposed proximate to the active area AA. The non-active area NAA may at least partially surround at least a portion of the active area AA in a plan view. In one example, the non-active area NAA may have a band shape surrounding an edge of the active area AA in a plan view. However, the present disclosure is not necessarily limited thereto. In the non-active area NAA, the image might not be displayed. The non-active area NAA might not detect a user's touch input, a fingerprint pattern, and a pen input. In the non-active area NAA, a signal line SL connected to the pixel PX may be disposed. The non-active area NAA may be defined as the remaining area of the display device 1 except for the active area AA.

The pad area PA may be disposed proximate to the non-active area NAA. The pad area PA may be disposed along an edge of the non-active area NAA. In one example, the pad area PA may be disposed along one long-side of the non-active area NAA extending in the first direction (X). However, the present disclosure is not necessarily limited thereto. The pad area PA may act as an area to which the connection circuit board FB is connected. An adhesive AD may be interposed between the pad area PA and the connection circuit board FB, so that the pad area and the board FB may be bonded to each other.

The connection circuit board FB may electrically connect the display panel DP and the main circuit board MB to each other. One side of the connection circuit board FB may be attached to the pad area PA of the display panel DP, while the opposite side of the connection circuit board FB may be attached to the main circuit board MB.

A plurality of connection circuit boards FB may be attached to the display panel DP and the main circuit board MB to electrically connect the display panel DP and the main circuit board MB to each other. In FIG. 1, four connection circuit boards FB arranged in the first direction (X) are illustrated. However, this is merely an example. An arrangement and the number of the connection circuit boards FB connecting the pad area PA of the display panel DP and the main circuit board MB to each other are not necessarily limited thereto.

The plurality of connection circuit boards FB may be arranged and spaced apart from each other by a constant spacing in the first direction (X). In one example, a spacing in the first direction (X) between adjacent ones of the plurality of connection circuit boards FB may be about 5 mm. However, the present disclosure is not necessarily limited thereto.

The connection circuit board FB may be flexible and may be bent. In one example, the connection circuit board FB may be embodied as a flexible circuit film. However, the present disclosure is not necessarily limited thereto.

The display device 1 may further include a driver DDM mounted on the connection circuit board FB.

The driver DDM may process an electrical signal output from the display panel DP and provide the processed signal to the main circuit board MB. The driver DDM may include at least one integrated circuit, for example, a display driver integrated circuit. For example, the driver DDM may be embodied as a display driver that provides an electrical signal for driving a plurality of pixels PX to the display panel DP. However, the present disclosure is not necessarily limited thereto. The driver DDM may be embodied as a touch driver including a touch driver integrated circuit for recognizing a user's touch input, a fingerprint pattern, and a pen input.

The main circuit board MB may be connected to the connection circuit board FB. The main circuit board MB may be electrically connected to the display panel DP via the connection circuit board FB. The main circuit board MB may provide image data, a control signal, a power voltage, etc. to the display panel DP or a driver circuit.

The adhesive AD may be electrically-conductive, and may be adhesive. The adhesive AD may attach and electrically connect the connection circuit board FB to the display panel DP and main circuit board MB. In one example, the adhesive AD may be embodied as an anisotropic conductive film. However, the present disclosure is not necessarily limited thereto.

Referring to FIG. 1 and FIG. 2, the display panel DP may include a substrate SUB, an active element layer ATL, an encapsulation layer ENP, and a polarizing layer POL.

The substrate SUB may be disposed across the active area AA, the non-active area NAA, and the pad area PA. The substrate SUB may include a single insulting layer or a plurality of insulating layers. In one implementation of the present disclosure, the substrate SUB may be embodied as a rigid substrate SUB including a rigid material such as glass. However, the present disclosure is not necessarily limited thereto. The substrate SUB may be embodied as, for example, a flexible substrate SUB including a flexible material such as polyimide.

The active element layer ATL may be disposed on one face of the substrate SUB. The active element layer ATL may be disposed in the active area AA. The active element layer ATL may include a light emissive element and a thin-film transistor driving the light emissive element.

The encapsulation layer ENP may be disposed on the active element layer ATL. The encapsulation layer ENP may protect the active element layer ATL while covering the active element layer ATL. The encapsulation layer ENP may include a plurality of encapsulation inorganic layers and at least one encapsulation organic layer. The encapsulation layer ENP may be replaced with a structure identical to or similar to the substrate SUB.

The polarizing layer POL may be disposed on the encapsulation layer ENP. The polarizing layer POL may reduce reflection of external light by polarizing light that passes therethrough. The polarizing layer POL may include, for example, a polarizing film. However, the present disclosure is not necessarily limited thereto. The polarizing layer POL may be omitted.

As shown in FIG. 2, in the pad area PA, the substrate SUB, the adhesive AD and the connection circuit board FB may overlap each other in the third direction (Z).

The adhesive AD may be interposed between the substrate SUB and the connection circuit board FB. A dimension in the second direction (Y) of the adhesive AD may be about 700 μm. However, the present disclosure is not necessarily limited thereto.

The substrate SUB may extend by a first distance D1 from the active area AA in the second direction (Y). The first distance D1 may be substantially equal to a sum of a dimension in the second direction (Y) of the non-active area NAA and a dimension in the second direction (Y) of the pad area PA. However, the present disclosure is not necessarily limited thereto. An edge of the connection circuit board FB may be spaced apart, by a second distance D2 smaller than the first distance D1, from the active area AA in the second direction (Y). In one example, the first distance D1 may be about 3.0 mm, while the second distance D2 may be about 430 μm. However, the present disclosure is not necessarily limited thereto.

The connection circuit board FB may include a base film BSF and a coated layer CL disposed on the base film BSF.

The base film BSF is flexible and thus may be bent without cracking or otherwise breaking. In the pad area PA, the substrate SUB of the display panel DP and the base film BSF may overlap each other in the third direction (Z).

The base film BSF may include a contact face BS_CS which partially faces toward the pad area PA of the display panel DP and a non-contact face BS_NCS opposite to the contact face BS_CS. A plurality of input pads (see "IPD_FB" in FIG. 3) and a plurality of output pads (see "OPD_FB" in FIG. 3) to be described later may be disposed on the contact face BS_CS in an exposed manner. The driver DDM may be mounted on the contact face BS_CS. However, the present disclosure is not necessarily limited thereto. The driver DDM may be mounted on the non-contact face BS_NCS.

The coated layer CL may be disposed on the contact face BS_CS. The coated layer CL may protect and electrically insulate a line (see 'SL' in FIG. 3) disposed on the base film BSF. The coated layer CL may include, for example, a solder resist. However, the present disclosure is not necessarily limited thereto.

The coated layer CL may cover only a portion of the contact face BS_CS. At least a portion of the contact face BS_CS overlapping the display panel DP might not be covered with the coated layer CL and may be exposed toward the pad area PA of the display panel DP. As shown in FIG. 2, a portion of the coated layer CL may overlap the display panel DP, specifically, the substrate SUB disposed in the pad area PA in the second direction (Y) and by a third distance TY1 as an overlapping distance. In one example, the third distance TY1 may be greater than about 0 mm but equal to or smaller than 160 μm. However, the present disclosure is not necessarily limited thereto. The coated layer CL might not to overlap the display panel DP in the third direction (Z).

Figure 3:
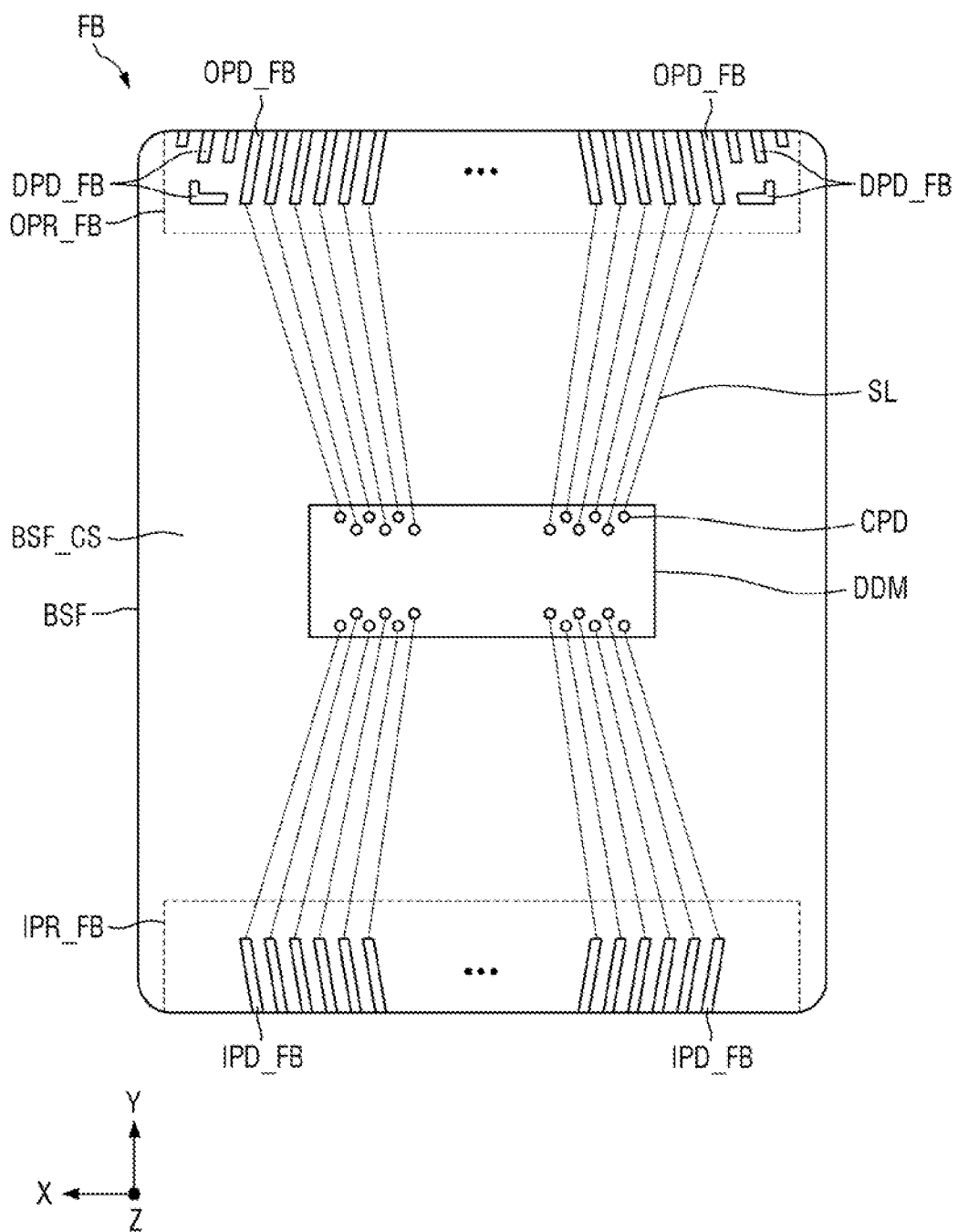
FIG. 3 is a plan view of a connection circuit board according to an implementation of the present disclosure.

FIG. 3 is a plan view of a connection circuit board according to an implementation of the present disclosure.

For convenience of description, the connection circuit board FB in FIG. 3 is shown in an upside down manner.

Referring to FIG. 1 to FIG. 3, the connection circuit board FB may have a rectangular planar shape having both short-sides extending in the first direction (X) and both long-sides extending in the second direction (Y). In one example, a dimension in the first direction (X) of the connection circuit board FB may be about 61 mm. However, a shape and a dimension value of the connection circuit board FB are not necessarily limited thereto.

The connection circuit board FB may include the plurality of output pads OPD_FB, a plurality of dummy output pads DPD_FB, the plurality of input pads IPD_FB, a plurality of lines SL, and a plurality of connection pads CPD.

In FIG. 3, the plurality of output pads OPD_FB, the plurality of dummy output pads DPD_FB, the plurality of input pads IPD_FB, the plurality of lines SL and the plurality of connection pads CPD are schematically shown. However, a shape, a dimension value, and the number thereof are not necessarily limited to those as shown in FIG. 3.

The plurality of output pads OPD_FB may be electrically connected to the display panel DP. The plurality of output pads OPD_FB may be disposed in an output pad area OPR_FB defined as one side area of the connection circuit board FB attached to the display panel DP. The output pad area OPR_FB may overlap the display panel DP or the adhesive AD.

The plurality of output pads OPD_FB may be arranged in the first direction (X) and disposed in the output pad area OPR_FB. The plurality of output pads OPD_FB may overlap each other in the first direction (X). The plurality of output pads OPD_FB may be disposed between both opposing groups of dummy output pads DPD_FB.

In FIG. 3, the plurality of output pads OPD_FB may be arranged in one row. However, the present disclosure is not necessarily limited thereto. The plurality of output pads OPD_FB may be arranged in a plurality of rows.

The plurality of dummy output pads DPD_FB may be disposed in the output pad area OPR_FB. Each of both opposing groups of dummy output pads DPD_FB may be adjacent to the plurality of output pads OPD_FB. The plurality of dummy output pads DPD_FB and the plurality of output pads OPD_FB may be arranged in the first direction (X) and may be disposed in the output pad area OPR_FB. Each of both opposing groups of dummy output pads DPD_FB may be positioned adjacent to the outermost output pad OPD_FB among the plurality of output pads OPD_FB. The plurality of output pads OPD_FB may be disposed between both opposing groups of dummy output pads DPD_FB. Some of the plurality of dummy output pads DPD_FB may be disposed between a portion of one edge of the connection circuit board FB extending in the second direction (Y) and the plurality of output pads OPD_FB, while the other of the plurality of dummy output pads DPD_FB may be disposed between a portion of the opposite edge of the connection circuit board FB extending in the second direction (Y) and the plurality of output pads OPD_FB. In one example, in FIG. 3, some of the plurality of dummy output pads DPD_FB may be disposed on a left side of a group of the plurality of output pads OPD_FB, while the other of the plurality of dummy output pads DPD_FB may be disposed on a right side of the group of the plurality of output pads OPD_FB. The plurality of dummy output pads DPD_FB may be symmetrically arranged with each other around the group of the plurality of output pads OPD_FB. However, the present disclosure is not necessarily limited thereto.

One end of the output pad OPD_FB and one end of the dummy output pad DPD_FB adjacent to an edge of the base film BSF may be aligned with an edge of the base film BSF extending in the first direction (X) in a plan view. However, the present disclosure is not necessarily limited thereto. One end of the output pad OPD_FB may be spaced apart from the edge of the base film BSF.

The plurality of dummy output pads DPD_FB might not be electrically connected to the driver DDM. The plurality of dummy output pads DPD_FB may be electrically insulated from the plurality of lines SL and the driver DDM.

The plurality of input pads IPD_FB may be electrically connected to the main circuit board MB. The plurality of input pads IPD_FB may be disposed in an input pad CPD_FB area PA defined as the opposite side area of the connection circuit board FB attached to the main circuit board MB. The input pad IPD_FB area PA may overlap the main circuit board MB or the adhesive AD. The plurality of input pads IPD_FB may be arranged in the first direction (X) and disposed in the input pad IPD_FB area PA. In FIG. 3, the plurality of input pads IPD_FB may be arranged in one row. However, the present disclosure is not necessarily limited thereto. The plurality of input pads IPD_FB may be arranged in a plurality of rows. One end of the input pad IPD_FB adjacent to an edge of the base film BSF may be aligned with the edge of the base film BSF in a plan view. However, the present disclosure is not necessarily limited thereto. One end of the input pad IPD_FB may be spaced apart from the edge of the base film BSF.

The plurality of lines SL may electrically connect the plurality of output pads OPD_FB and the plurality of input pads IPD_FB to the driver DDM. One end of the line SL may be connected to the output pad OPD_FB or the input pad IPD_FB, and the opposite end of the line SL may be connected to the connection pad CPD.

The plurality of connection pads CPD may be electrically connected to the driving circuit. In FIG. 3, the plurality of connection pads CPD are arranged to have a certain arrangement with a repeating pattern. However, the present disclosure are not necessarily limited thereto. The plurality of connection pads CPD may be irregularly arranged.

Figure 4:
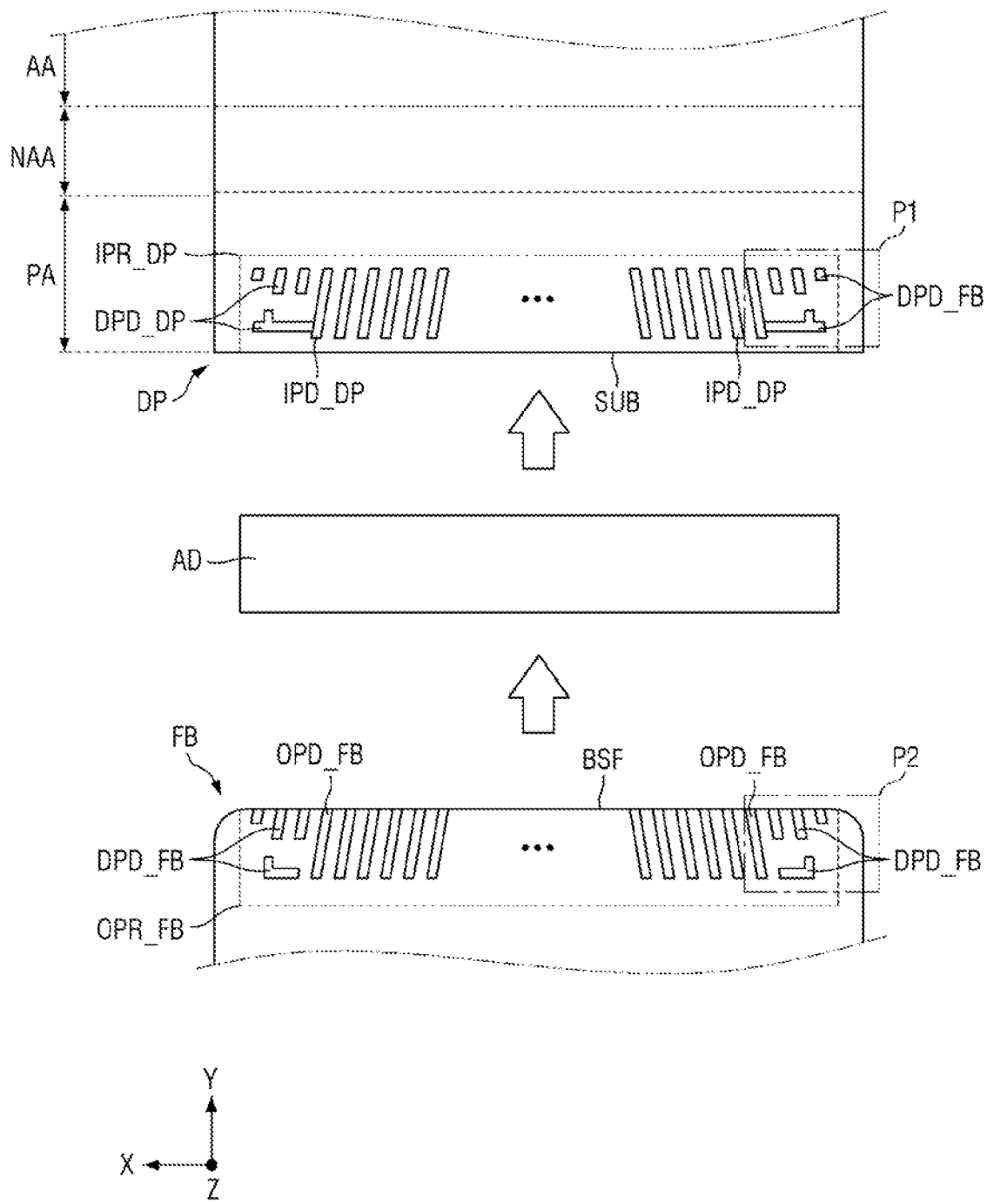
FIG. 4 is a plan view showing a state in which a display panel and a connection circuit board are separated from each other according to one implementation of the present disclosure.
Figure 5:
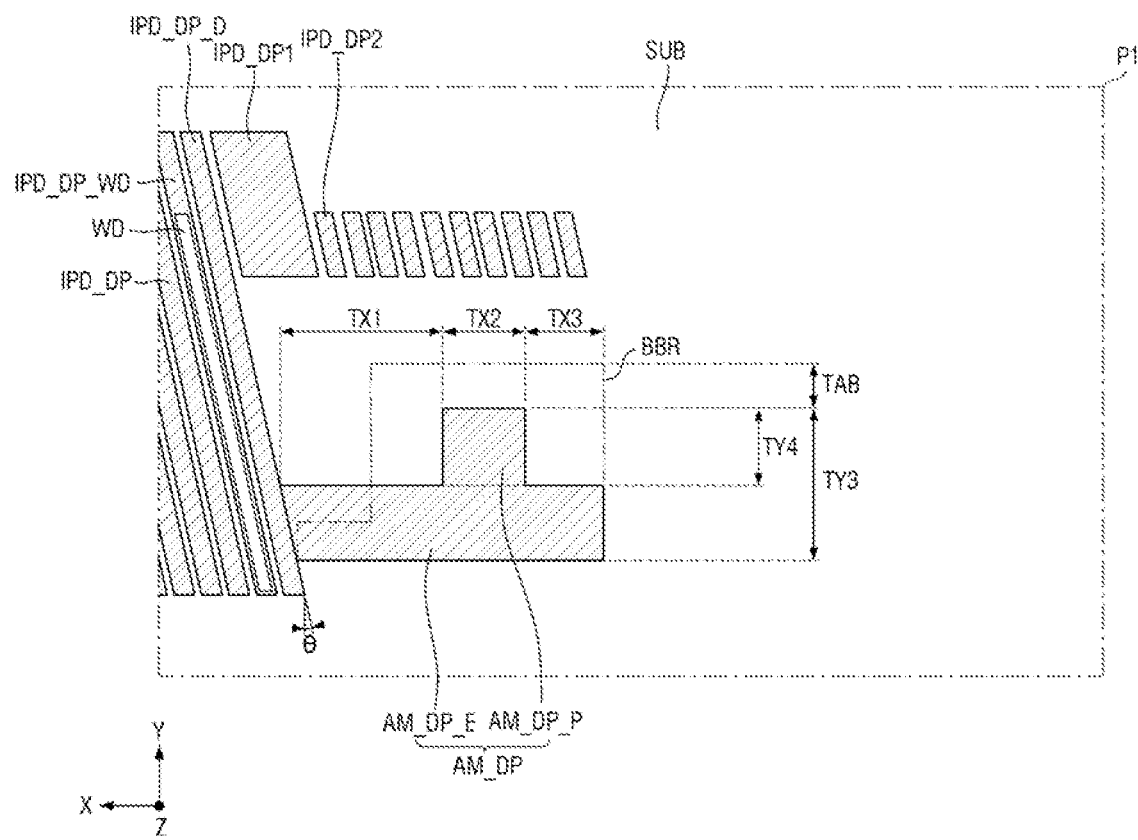
FIG. 5 is a plan view of a 'P1' area of FIG. 4.
Figure 6:
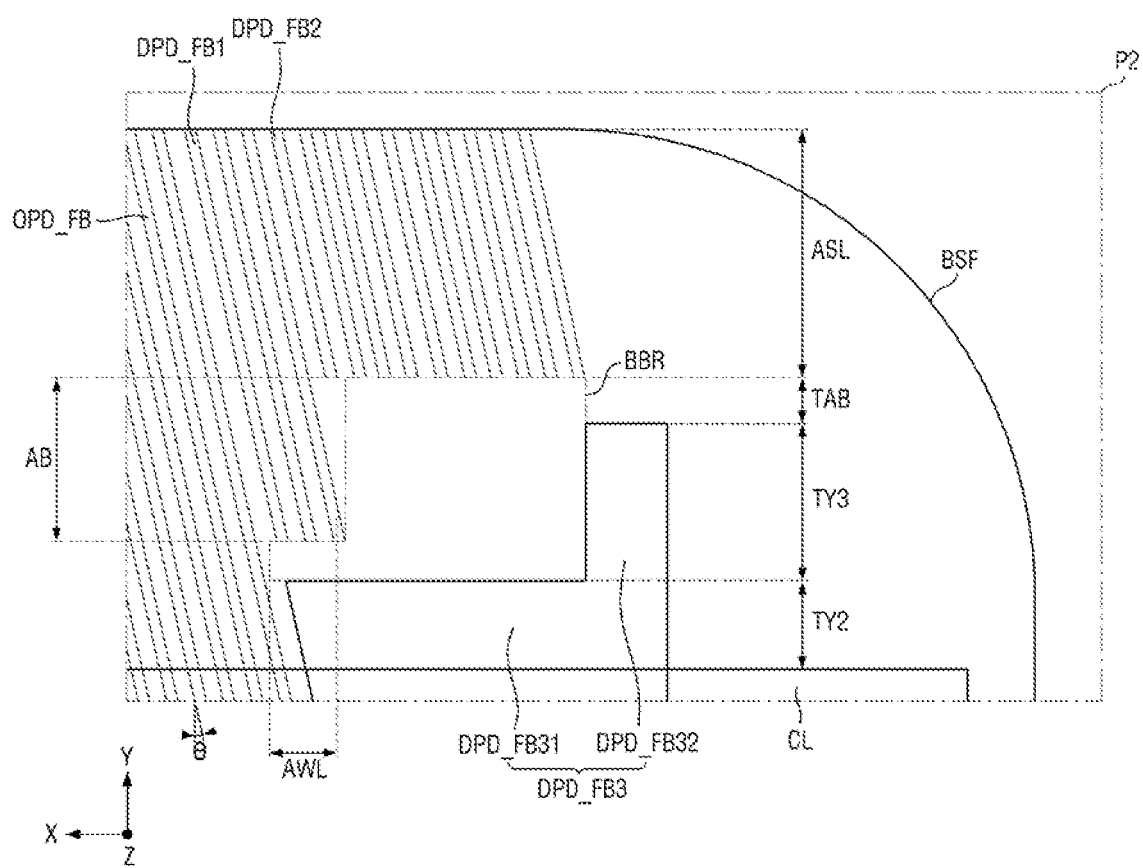
FIG. 6 is a plan view of a 'P2' area of FIG. 4.

FIG. 4 is a plan view showing a state in which a display panel and a connection circuit board are separated from each other according to one implementation of the present disclosure. FIG. 5 is a plan view of a 'P1' area of FIG. 4. FIG. 6 is a plan view of a 'P2' area of FIG. 4.

For convenience of description, in FIGS. 4 to 7, the display panel DP and the connection circuit board FB are shown in an upside down manner. A plurality of panel pads IPD_DP and a plurality of dummy panel pads DPD_DP to be described later are actually disposed on one face (top face of the substrate SUB in FIG. 2) of the substrate SUB overlapping the connection circuit board FB. However, the plurality of panel pads IPD_DP and the plurality of dummy panel pads DPD_DP are shown in a projected manner on the opposite face (bottom face of the substrate SUB in FIG. 2) of the substrate SUB opposite to one face of the substrate SUB.

Referring to FIG. 4, the display panel DP may include the plurality of panel pads IPD_DP and the plurality of dummy panel pads DPD_DP.

The plurality of panel pads IPD_DP may be disposed in a panel pad area IPR_DP. The plurality of panel pads IPD_DP may be arranged in the first direction (X) and disposed in the panel pad area IPR_DP. The plurality of panel pads IPD_DP may overlap each other in the first direction (X). The plurality of panel pads IPD_DP may be disposed between both opposing groups of the plurality of dummy panel pads DPD_DP.

The plurality of panel pads IPD_DP may be positioned to respectively correspond to the plurality of input pads IPD_FB. As will be described later, the plurality of panel pads IPD_DP may at least partially overlap the plurality of input pads IPD_FB.

The plurality of panel pads IPD_DP may be electrically and respectively connected to the plurality of input pads IPD_FB via the adhesive AD. The plurality of panel pads IPD_DP may be electrically connected to the active element layer ATL. The active element layer ATL may be electrically connected to the flexible circuit board SUB via the plurality of panel pads IPD_DP to receive a data signal and a control signal for driving the plurality of pixels PX.

The plurality of dummy panel pads DPD_DP may be disposed in a panel pad area IPR_DP. The plurality of dummy panel pads DPD_DP and the plurality of panel pads IPD_DP may be arranged in the first direction (X).

Each of both opposing groups of the plurality of dummy panel pads DPD_DP may be positioned adjacent to a group of the plurality of panel pads IPD_DP. Each of both opposing group of the plurality of dummy panel pads DPD_DP may be adjacent to the outermost panel pad IPD_DP s among the plurality of panel pads IPD_DP.

The plurality of panel pads IPD_DP may be disposed between both opposing groups of the plurality of dummy panel pads DPD_DP. In one example, in FIG. 4, one of both opposing groups of the plurality of dummy panel pads DPD_DP may be disposed on a left side of a group of the plurality of panel pads IPD_DP, while the other of both opposing groups of the plurality of dummy panel pads DPD_DP may be disposed on a right side of a group of the plurality of panel pads IPD_DP. Both opposing groups of the plurality of dummy panel pads DPD_DP may be arranged symmetrically with respect to each other around a group of the plurality of panel pads IPD_DP. However, the present disclosure is not necessarily limited thereto.

The plurality of dummy panel pads DPD_DP may be respectively disposed at positions corresponding to the plurality of dummy output pads DPD_FB. As will be described later, some of the plurality of dummy panel pads DPD_DP may overlap the plurality of dummy output pads DPD_FB.

The plurality of dummy panel pads DPD_DP might not be electrically connected to the active element layer ATL. The plurality of dummy panel pads DPD_DP may be electrically insulated from the active element layer ATL.

As described above, the connection circuit board FB may be attached to the display panel DP via the adhesive AD. In this case, the output pad area OPR_FB of the connection circuit board FB may overlap the panel pad area IPR_DP of the display panel DP. In one example, the connection circuit board FB may be attached to the display panel DP using a tool that thermally compresses and cure the adhesive AD. However, the present disclosure is not necessarily limited thereto.

In one implementation of the present disclosure, each of the panel pad area IPR_DP and the output pad area OPR_FB has a symmetrical structure with respect to a virtual axis of the second direction (Y) passing through a center thereof. Thus, hereinafter, portions P1 and P2 of FIG. 4 in FIG. 5 to FIG. 10 will be mainly described with reference to FIG. 5 to FIG. 10.

Referring further to FIG. 5, the plurality of panel pads IPD_DP may include a first panel pad IPD_DP_C, a second panel pad IPD_DP_WD, and a third panel pad IPD_DP_D.

The first panel pad IPD_DP_C, the second panel pad IPD_DP_WD, and the third panel pad IPD_DP_D may be arranged in the first direction (X). The first panel pad IPD_DP_C, the second panel pad IPD_DP_WD, and the third panel pad IPD_DP_D may overlap each other in the first direction (X).

A plurality of first panel pads IPD_DP_C, one second panel pad IPD_DP_WD, and one third panel pad IPD_DP_D may be disposed in the area 'P1' of the panel pad area IPR_DP overlapping a corner area of the connection circuit board FB. However, the present disclosure is not necessarily limited thereto.

The plurality of first panel pads IPD_DP_C, the second panel pads IPD_DP_WD, and the third panel pads IPD_DP_D may be arranged and spaded from each other by a small pitch or spacing in the first direction (X). In one example, the pitch may be about 25 µm. However, the present disclosure is not necessarily limited thereto.

The number of the plurality of first panel pads IPD_DP_C may be larger than a total number of the second panel pad IPD_DP_WD and the third panel pad IPD_DP_D. Referring further to FIG. 2, the first panel pad IPD_DP_C may be electrically connected to the active element layer ATL. The first panel pad IPD_DP_C may transmit an electrical signal input from the driver DDM via the output pad OPD_FB to the active element layer ATL.

The second panel pad IPD_DP_WD may be disposed between the first panel pad IPD_DP_C and the third panel pad IPD_DP_D. A window WD passing through an inner area of the second panel pad IPD_DP_WD may be defined in the second panel pad IPD_DP_WD. The window WD has a size smaller than that of the second panel pad IPD_DP_WD, and may have the same or similar planar shape as or to a planar shape of the second panel pad IPD_DP_WD.

The third panel pad IPD_DP_D may act as the outermost panel pad IPD_DP of the plurality of panel pads IPD_DP. The third panel pad IPD_DP_D may include a plurality of the third panel pads IPD_DP_D arranged in the first direction (X). The third panel pad IPD_DP_D may be connected to a panel alignment mark AM_DP. However, the present disclosure is not necessarily limited thereto.

The second panel pad IPD_DP_WD and the third panel pad IPD_DP_D might not be electrically connected to the active element layer ATL. For example, each of the second panel pad IPD_DP_WD and the third panel pad IPD_DP_D may act as a dummy electrode that does not transmit the electrical signal input through the output pad OPD_FB from the driver DDM to the active element layer ATL. However, the present disclosure is not necessarily limited thereto. At least one of the second panel pad IPD_DP_WD or the third panel pad IPD_DP_D may be electrically connected to the active element layer ATL, and may perform substantially the same or similar function as or to that of the first panel pad IPD_DP_C.

Each of the first panel pad IPD_DP_C, the second panel pad IPD_DP_WD and the third panel pad IPD_DP_D have a planar shape of approximately a parallelogram and may extend in a diagonal direction intersecting the first direction (X) and the second direction (Y). In one example, an angle θ between an extension direction of each of the first panel pad IPD_DP_C, the second panel pad IPD_DP_WD and the third panel pad IPD_DP_D and the second direction (Y) may be greater than about 0° and smaller than 90°. The angle θ may be measured as an angle between the second direction (Y) and an edge of each of the first panel pad IPD_DP_C, the second panel pad IPD_DP_WD, and the third panel pad IPD_DP_D extending in the diagonal direction.

The plurality of dummy panel pad DPD_DP may include a first dummy panel pad DPD_DP1, a second dummy panel pad DPD_DP2, and the panel alignment mark AM_DP.

One first dummy panel pad DPD_DP1 and a plurality of second dummy panel pads may be disposed in the portion "P1" of the panel pad area IPR_DP overlapping the corner area of the connection circuit board FB. However, the numbers thereof are not necessarily limited thereto.

The first dummy panel pad DPD_DP1, the second dummy panel pad DPD_DP2, and the panel pad IPD_DP may be arranged in the first direction (X). The first dummy panel pad DPD_DP1 and the second dummy panel pad DPD_DP2 may overlap the panel pad IPD_DP in first direction (X).

The first dummy panel pad DPD_DP1 may be positioned adjacent to the third panel pad IPD_DP_D. A spacing between a position of the first dummy panel pad DPD_DP1 and a center of the panel pad area IPR_DP may be larger than a spacing between the third panel pad IPD_DP_D and the center of the panel pad area IPR_DP. The first dummy panel pad DPD_DP1 may be disposed between the third panel pad IPD_DP_D and the second dummy panel pad DPD_DP2.

The second dummy panel pad DPD_DP2 may be positioned adjacent to the first dummy panel pad DPD_DP1. A spacing between the second dummy panel pad DPD_DP2 and a center of the panel pad area IPR_DP may be larger than a spacing between the first dummy panel pad DPD_DP1 and the center of the panel pad area IPR_DP.

The plurality of panel pads IPD_DP, the first dummy panel pad DPD_DP1, and the plurality of second dummy panel pads DPD_DP2 may be arranged and spaced apart from each other by the same spacing in the first direction (X). The second dummy panel pad DPD_DP2 may be arranged by substantially the same pitch as the pitch by which the panel pads IPD_DP are arranged. However, the present disclosure is not necessarily limited thereto. An arrangement pitch of the plurality of panel pads IPD_DP, that of the first dummy panel pads DPD_DP1, and/or that of the plurality of second dummy panel pads DPD_DP2 may be different from each other.

Extension angles θ of the panel pad IPD_DP, the first dummy panel pad DPD_DP1 and the second dummy panel pad DPD_DP2 may be substantially the same as each other. For example, the panel pad IPD_DP, the first dummy panel pad DPD_DP1, and the second dummy panel pad DPD_DP2 may extend in a parallel manner to each other in a plan view. However, the present disclosure is not necessarily limited thereto. The extension angle θ of the panel pad IPD_DP, that of the first dummy panel pad DPD_DP1, and/or that of the second dummy panel pad DPD_DP2 may be different from each other.

A length of the panel pad IPD_DP may be greater than that of the first dummy panel pad DPD_DP1. A length of the first dummy panel pad DPD_DP1 may be larger than that of the second dummy panel pad DPD_DP2. The length may be measured along an extension direction of each of the panel pad IPD_DP, the first dummy panel pad DPD_DP1, and the second dummy panel pad DPD_DP2.

A width of the first dummy panel pad DPD_DP1 may be larger than that of each of the panel pad IPD_DP and the second dummy panel pad DPD_DP2. In one example, the width of the first dummy panel pad DPD_DP1 may be at least 3 times greater than the width of the panel pad IPD_DP or the second dummy panel pad DPD_DP2. The width of the second dummy panel pad DPD_DP2 may be equal to that of the second dummy panel pad DPD_DP2. However, the present disclosure is not necessarily limited thereto.

One end of the panel pad IPD_DP facing toward the active area AA on a plan view may be aligned to overlap one end of the first dummy panel pad DPD_DP1 facing toward the active area AA in the first direction (X). One end of the second dummy panel pad DPD_DP2 facing toward the active area AA might not be aligned with one end of the first dummy panel pad DPD_DP1 facing toward the active area AA. For example, a distance between one end of the second dummy panel pad DPD_DP2 facing toward the active area AA and the panel alignment mark AM_DP may be smaller than a distance between one end of the first dummy panel pad DPD_DP1 facing toward the active area AA and the panel alignment mark AM_DP. For example, the second dummy panel pad DPD_DP2 may be closer to the active area AA than the panel alignment mark AM_DP may be. The opposite end of the second dummy panel pad DPD_DP2 to opposite to one end thereof may be aligned to overlap the opposite end of the first dummy panel pad DPD_DP1 in the first direction (X). However, the present disclosure is not necessarily limited thereto. The alignment relationship between the ends of the panel pad IPD_DP, the first dummy panel pad DPD_DP1 and the second dummy panel pad DPD_DP2 may vary according to a design of the display device 1.

The panel alignment mark AM_DP may be positioned adjacent to the third panel pad IPD_DP_D. The panel alignment mark AM_DP may have an approximate 'T' shape in a plan view.

The panel alignment mark AM_DP may include an extension AM_DP_E extending in the first direction (X), and a protrusion AM_DP_P protruding from the extension in the second direction (Y) toward the second dummy panel pad DPD_DP2.

One end of the extension AM_DP_E may be positioned adjacent to the third panel pad IPD_DP_D, while the opposite end opposite to one end of the extension AM_DP_E, may protrude from the third panel pad IPD_DP_D. One end of the extension AM_DP_E may be in contact with the third panel pad IPD_DP_D so that the extension AM_DP_E and the third panel pad IPD_DP_D may be connected to each other. However, the present disclosure is not necessarily limited thereto.

A fourth distance TX1 from one end of the extension AM_DP_E to the protrusion AM_DP_P thereof may be greater than or equal to a first length TX2 in the first direction (X) of the protrusion AM_DP_P. Accordingly, the protrusion AM_DP_P and the opposite end of the extension AM_DP_E may be more easily recognized by a vision camera or the like. The first length TX2 may be equal to a fifth distance from the protrusion AM_DP_P to the opposite end of the extension AM_DP_E or a fourth length TY4 to be described later. In one example, the fourth distance TX1, the first length TX2, and the fifth distance may be about 120 μm, 50 μm, and 50 μm, respectively. However, the present disclosure is not necessarily limited thereto.

The protrusion AM_DP_P may protrude from the extension AM_DP_E by the fourth length TY4 in the second direction (Y). The fourth length TY4 may be equal to the first length TX2 or a fifth distance TX3 to be described later. The fourth length TY4 may be smaller than a seventh distance TAB which will be described later. In one example, the fourth length TY4 may be about 100 μm. However, the present disclosure is not necessarily limited thereto. The fourth length TY4 may be different from the first length TX2 or the fifth distance TX3.

Referring further to FIG. 6, as described above, the connection circuit board FB may include the plurality of output pads OPD_FB and the plurality of dummy output pads DPD_FB.

The plurality of output pads OPD_FB and the plurality of dummy output pads DPD_FB may be arranged in the first direction (X). The plurality of output pads OPD_FB and the plurality of dummy output pads DPD_FB may overlap each other in the first direction (X). As shown in FIG. 3, FIG. 4, and FIG. 6, a spacing between the plurality of output pads OPD_FB and an edge extending in the second direction (Y) of the base film BSF in the first direction (X) may be larger than a spacing between the plurality of dummy output pads DPD_FB and the edge extending in the second direction (Y) of the base film BSF in the first direction (X).

The plurality of output pads OPD_FB may be arranged by a small pitch or spacing in the first direction (X). An arrangement pitch of the plurality of output pads OPD_FB may be equal to that of the plurality of panel pads IPD_DP. In one example, the pitch may be about 25 μm. However, the present disclosure is not necessarily limited thereto.

Each of the plurality of output pads OPD_FB may extend in a diagonal direction intersecting the first direction (X) and the second direction (Y). The plurality of output pads OPD_FB may extend in the same direction as the extension direction of the plurality of panel pads IPD_DP. In one example, an angle θ formed between the second direction (Y) and the extension direction of the plurality of output pads OPD_FB may be greater than about 0° and smaller than 90°. The angle θ may be measured between the second direction (Y) and an edge of each of the plurality of output pads OPD_FB extending in the diagonal direction.

The plurality of dummy output pads DPD_FB may be closer to an edge extending in the second direction (Y) of the base film BSF and an edge of a corner area connected thereto than the plurality of output pads OPD_FB may be.

The plurality of dummy output pads DPD_FB may include a first dummy output pad DPD_FB1, a second dummy output pad DPD_FB2, and a third dummy output pad DPD_FB3.

The plurality of output pads OPD_FB, the plurality of first dummy output pads DPD_FB1, the plurality of second dummy output pads DPD_FB2, and the third dummy output pad DPD_FB3 may be disposed in a corner area 'P2' of the connection circuit board FB.

The number of the plurality of dummy output pads DPD_FB may be smaller than that of the plurality of output pads OPD_FB. The number of the plurality of first dummy output pads DPD_FB1 may be smaller than the number of the plurality of second dummy output pads DPD_FB2. In one example, three first dummy output pads DPD_FB1, ten second dummy output pads DPD_FB2 and one third dummy output pad DPD_FB3 may be disposed in the corner area 'P2' of the connection circuit board FB. However, the numbers thereof are not necessarily limited thereto.

Referring further to FIG. 3 and FIG. 4, the plurality of first dummy output pads DPD_FB1 and the plurality of second dummy output pads DPD_FB2 may be sequentially arranged between the outermost output pad OPD_FB of the plurality of output pads OPD_FB and an edge extending in the second direction (Y) of the base film BSF. The first dummy output pad DPD_FB1 may be disposed between the output pad OPD_FB and the second dummy output pad DPD_FB2.

Each of the first dummy output pad DPD_FB1 and the second dummy output pad DPD_FB2 may have a planar shape of an approximate parallelogram. A dimension in the first direction (X) of the first dummy output pad DPD_FB1 may be equal to that of the second dummy output pad DPD_FB2. A dimension in the first direction (X) of each of the first dummy output pad DPD_FB1 and the second dummy output pad DPD_FB2 may be equal to that of the output pad OPD_FB. However, the present disclosure is not necessarily limited thereto. A dimension in the first direction (X) of the output pad OPD_FB, that of the first dummy output pad DPD_FB1, and/or that of the second dummy output pad DPD_FB2 may be different from each other.

Each of the first dummy output pad DPD_FB1 and the second dummy output pad DPD_FB2 may extend in a diagonal direction intersecting the first direction (X) and the second direction (Y). The extension direction of each of the first dummy output pad DPD_FB1 and the second dummy output pad DPD_FB2 may be equal to that of each of the plurality of output pads OPD_FB. An angle θ formed between each of the first dummy output pad DPD_FB1 and the second dummy output pad DPD_FB2 and the second direction (Y) may be equal to an angle between the output pad OPD_FB and the second direction (Y). For example, the output pad OPD_FB, the first dummy output pad DPD_FB1, and the second dummy output pad DPD_FB2 may extend in a parallel manner to each other in a plan view. However, the present disclosure is not necessarily limited thereto. An extension direction of each of the first dummy output pad DPD_FB1 and the second dummy output pad DPD_FB2 may be different from that of each of the plurality of output pads OPD_FB.

A length of each of the first dummy output pad DPD_FB1 and the second dummy output pad DPD_FB2 may be smaller than that of the output pad OPD_FB. The length of the second dummy output pad DPD_FB2 may be smaller than that of the first dummy output pad DPD_FB1. The length may be measured in the second direction (Y) or in a diagonal direction in which the first dummy output pad DPD_FB1 and the second dummy output pad DPD_FB2 extend.

One end of each of the output pad, the first dummy output pad DPD_FB1 and the second dummy output pad DPD_FB2 facing toward the active area AA of the display panel DP may be aligned with an edge extending in the first direction (X) of the base film BSF. However, the present disclosure is not necessarily limited thereto. One end of each of the output pad, the first dummy output pad DPD_FB1 and the second dummy output pad DPD_FB2 may be spaced apart from the edge extending in the first direction (X) of the base film BSF.

The second dummy output pad DPD_FB2 has a second length ASL in the second direction (Y). The first dummy output pad DPD_FB1 protrude by a third length AB in the second direction (Y) toward the third dummy output pad DPD_FB3 or the coated layer CL in a plan view. The third length AB may be smaller than the second length ASL. In one example, the second length ASL may be about 450 μm, while the third length AB may be about 120 sm. However, the present disclosure is not necessarily limited thereto.

A first dimension AWL in the first direction (X) along which the plurality of first dummy output pads DPD_FB1 are arranged may be smaller than that along which the plurality of second output pads OPD_FB are arranged. In one example, the first width AWL may be about 90 μm. However, the present disclosure is not necessarily limited thereto.

The arrangement pitch of the plurality of first dummy output pads DPD_FB1 and that of the plurality of second dummy output pads DPD_FB2 may be equal to the arrangement pitch of the plurality of output pads OPD_FB. Each of a spacing between the output pad OPD_FB and the first dummy output pad DPD_FB1 and a spacing between the first dummy output pad DPD_FB1 and the second output pad OPD_FB may be equal to the arrangement pitch of the plurality of output pads OPD_FB. For example, the plurality of output pads OPD_FB, the plurality of first dummy output pads DPD_FB1 and the plurality of second dummy output pads DPD_FB2 may be arranged by the same predetermined pitch. In one example, the pitch may be about 25 μm. However, the present disclosure is not necessarily limited thereto. The arrangement pitch of the plurality of output pads OPD_FB, that of the plurality of first dummy output pads DPD_FB1 and/or that of the plurality of second dummy output pads DPD_FB2 may be different from each other.

A spacing in a direction inward of the base film BSF (direction opposite to the second direction (Y)) between the third dummy output pad DPD_FB3 and the edge extending in the first direction (X) of the base film BSF may be larger than a spacing in a direction inward of the base film BSF (direction opposite to the second direction (Y)) between the first dummy output pad DPD_FB1 or the second dummy output pad DPD_FB2 and the edge extending in the first direction (X) of the base film BSF in a plan view.

The third dummy output pad DPD_FB3 may function to prevent flow phenomenon of the adhesive AD. The third dummy output pad DPD_FB3 may further function as an alignment mark. In one example, the third dummy output pad DPD_FB3 may have an L-shaped planar shape. However, the present disclosure is not necessarily limited thereto.

The third dummy output pad DPD_FB3 may include a first extension DPD_FB31 extending in the first direction (X) and a second extension DPD_FB32 extending in the second direction (Y).

The first extension DPD_FB31 may overlap the output pad OPD_FB in the first direction (X). The first extension DPD_FB31 might not overlap the first dummy output pad DPD_FB1 and the second dummy output pad DPD_FB2 in the first direction (X). The first extension DPD_FB31 may be spaced apart from the first dummy output pad DPD_FB1 and the second dummy output pad DPD_FB2 in the second direction (Y). A spacing in the second direction (Y) between the first extension DPD_FB31 and the first dummy output pad DPD_FB1 may be smaller than a spacing in the second direction (Y) between the first extension DPD_FB31 and the second dummy output pad DPD_FB2.

In a plan view, an edge of the first extension DPD_FB31 facing toward the first dummy output pad DPD_FB1 and the second dummy output pad DPD_FB2, and extending in the first direction (X) may be spaced apart from the coated layer CL by a sixth distance TY2 in the second direction (Y). The sixth distance TY2 may be equal to the fifth distance TX3. The sixth distance TY2 may be smaller than the second length ASL. In one example, the sixth distance TY2 may be about 100 μm. However, the present disclosure is not necessarily limited thereto.

In a plan view, the edge of the first extension DPD_FB31 facing toward the outermost output pad OPD_FB among the plurality of output pads OPD_FB may extend in the same direction as the extension direction of the output pad OPD_FB. However, the present disclosure is not necessarily limited thereto.

In a plan view, the second extension DPD_FB32 may protrude, in the second direction (Y), from one end of the first extension DPD_FB31 facing toward an edge of the base film BSF extending in the second direction (Y). The second extension DPD_FB32 may protrude by a fourth length TY4. In one example, the fourth length TY4 may be about 100 μm. However, the present disclosure is not necessarily limited thereto.

In a plan view, the second extension DPD_FB32 might not overlap the first dummy output pad DPD_FB1 and the second dummy output pad DPD_FB2 in the second direction (Y). However, the present disclosure is not necessarily limited thereto. The second extension DPD_FB32 may partially overlap the second dummy output pad DPD_FB2 in the second direction (Y).

The second dummy output pad DPD_FB2 may be spaced apart from an end of the second extension DPD_FB32 by the seventh distance TAB in the second direction (Y). The seventh distance TAB may be smaller than the fifth distance TX3, the second length ASL, or the sixth distance TY2. In one example, the seventh distance TAB may be about 50 μm. However, the present disclosure is not necessarily limited thereto.

The second extension DPD_FB32 may protrude, in the second direction (Y), beyond the extension AM_DP_E of the panel alignment mark AM_DP in a plan view. The second extension DPD_FB32 may function as an alignment mark. An end of the second extension DPD_FB32 may protrude in the same direction as a protrusion direction of an end of the protrusion AM_DP_P of the panel alignment mark AM_DP in a plan view. An end of the second extension DPD_FB32 may be aligned, in the second direction (Y), with an end of the protrusion AM_DP_P of the panel alignment mark AM_DP in a plan view. However, the present disclosure is not necessarily limited thereto.

The third dummy output pad DPD_FB3 may surround at least a portion of the panel alignment mark AM_DP in a plan view. For example, the third dummy output pad DPD_FB3 may surround a corner area of the extension AM_DP_E of the panel alignment mark AM_DP in a plan view.

The first extension DPD_FB31 and the second extension DPD_FB32 may surround edges of the extension AM_DP_E of the panel alignment mark AM_DP. The first extension DPD_FB31 may surround an edge of the extension AM_DP_E of the panel alignment mark AM_DP extending in the first direction (X) in a plan view. The second extension DPD_FB32 may surround an edge of the extension AM_DP_E of the panel alignment mark AM_DP extending in the second direction (Y) in a plan view.

The corner area of the base film BSF may be rounded to have a predefined curvature in a plan view. In one example, a radius of the predefined curvature may be about 0.6 mm. However, the present disclosure is not necessarily limited thereto.

Figure 7:
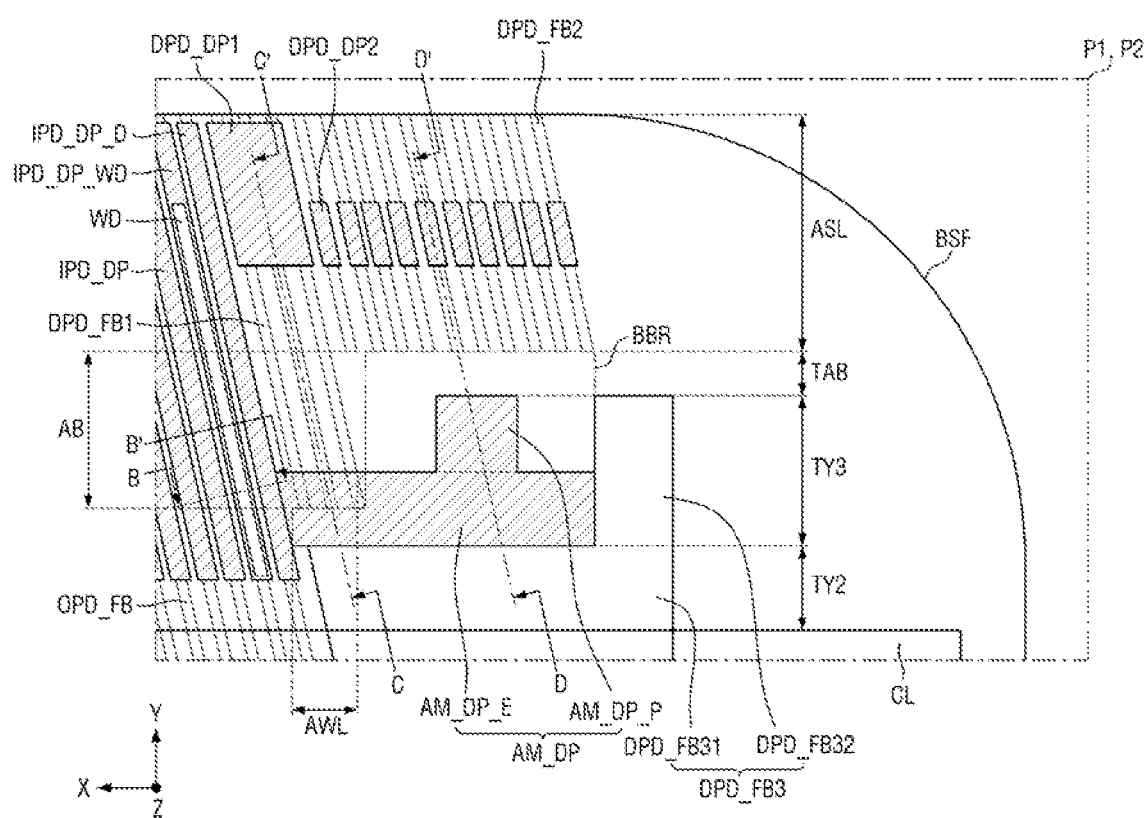
FIG. 7 is a plan view of the 'P1' and P2' areas of FIG. 4 when the display panel and the connection circuit board are coupled to each other according to one implementation of the present disclosure.
Figure 8:
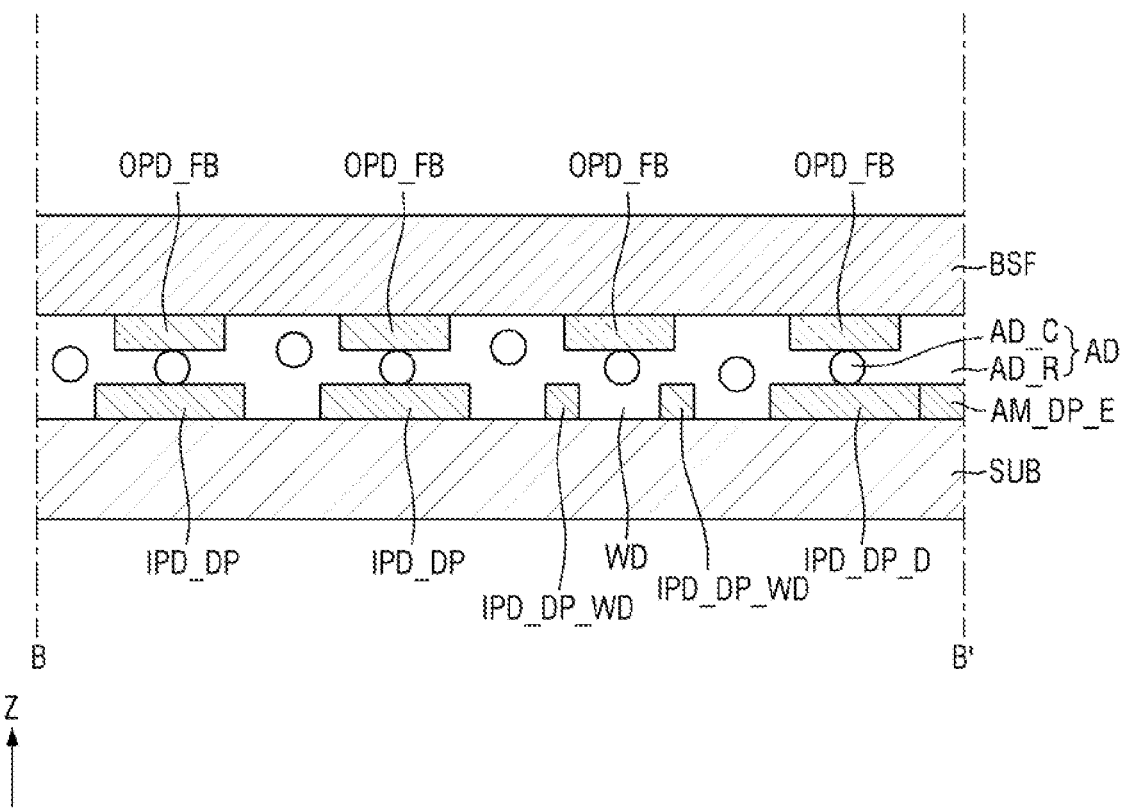
FIG. 8 is a cross-sectional view taken along a line B-B' in FIG. 7.
Figure 9:
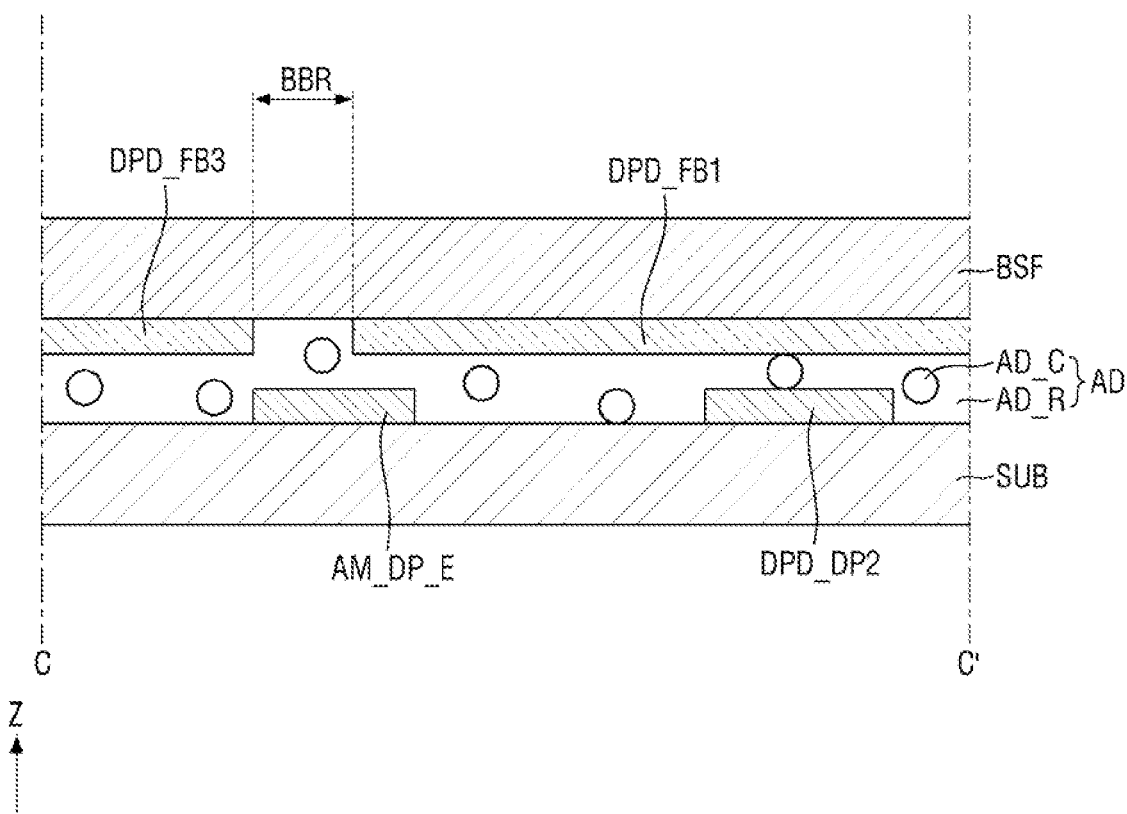
FIG. 9 is a cross-sectional view taken along a line C-C' in FIG. 7.
Figure 10:
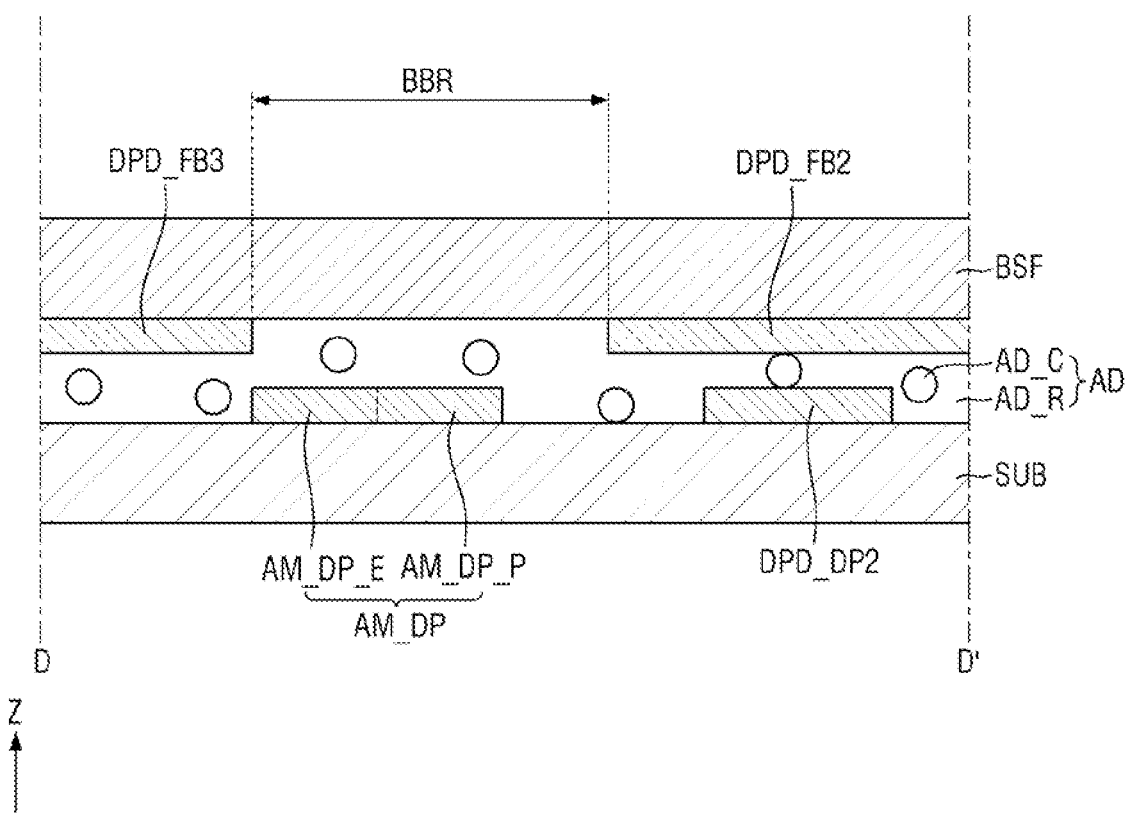
FIG. 10 is a cross-sectional view taken along a line D-D' in FIG. 7.

FIG. 7 is a plan view of the 'P1' and 'P2' areas of FIG. 4 when the display panel DP and the connection circuit board are combined to each other according to an embodiment. FIG. 8 is a cross-sectional view taken along a line B-B' in FIG. 7. FIG. 9 is a cross-sectional view taken along a line C-C in FIG. 7. FIG. 10 is a cross-sectional view taken along a line D-D' in FIG. 7.

Further referring to FIG. 7 to FIG. 10, as described above, the adhesive AD may be interposed between the connection circuit board FB and the display panel DP.

The adhesive AD may include a base resin AD_R and a plurality of conductive particles AD_C dispersed in the base resin AD_R.

The base resin AD_R may include a thermosetting material or a thermosetting material. In one example, the base resin AD_R may include styrene butadiene, polyvinyl butylene, epoxy resin, polyurethane resin, acrylic resin, etc. However, the present disclosure is not necessarily limited thereto.

The conductive particle AD_C may have a fine size, and may be coated with a conductive material. In one example, the conductive particle AD_C may have a diameter of about 3 μm to 15 μm, and may be coated with a conductive metal layer such as Au, Ni or Pd. However, the present disclosure is not necessarily limited thereto.

As shown in FIG. 7, when the connection circuit board FB is connected to the display panel DP, a length by which the panel pad IPD_DP overlaps the output pad OPD_FB in the second direction (Y) or the diagonal direction may be larger than each of a length by which the first dummy panel pad DPD_DP1 and the first dummy output pad DPD_FB1 overlap each other, and a length by which the second dummy panel pad DPD_DP2 and the second dummy output pad DPD_FB2 overlap each other. In this case, a length by which the first dummy panel pad DPD_DP1 and the first dummy output pad DPD_FB1 overlap each other may be greater than a length by which the second dummy panel pad DPD_DP2 and the second dummy output pad DPD_FB2 overlap each other.

As shown in FIG. 7 and FIG. 8, when the connection circuit board FB is connected to the display panel DP, the plurality of panel pads IPD_DP may respectively overlap the plurality of output pads OPD_FB in the third direction (Z). A dimension in the second direction (Y) of the panel pad IPD_DP may be larger than that of the output pad OPD_FB. However, the present disclosure is not necessarily limited thereto. The dimension in the second direction (Y) of the panel pad IPD_DP may be smaller than or equal to that of the output pad OPD_FB. The second panel pad IPD_DP_WD may expose a portion of the output pad OPD_FB in the third direction (Z) through the window WD. Accordingly, whether the plurality of panel pads IPD_DP and the plurality of output pads OPD_FB are respectively aligned with each other may be identified.

As shown in FIG. 7 and FIG. 9, when the connection circuit board FB is coupled to the display panel DP, the first dummy panel pad DPD_DP1 may overlap a plurality of first dummy output pads DPD_FB1 in the third direction (Z). In one implementation of the present disclosure, one first dummy panel pad DPD_DP1 may overlap three first dummy output pads DPD_FB in the third direction (Z). The number of the first dummy output pads DPD_FB1 overlapping the first dummy panel pad DPD_DP1 is not necessarily limited thereto. As shown in FIG. 9, at least one conductive particle AD_C may be interposed between the first dummy panel pad IPD_DP and the first dummy output pad DPD_FB1. As described above, the dimension in the first direction (X) of the first dummy panel pad DPD_DP1 is larger than that of the panel pad IPD_DP. Thus, whether the conductive particle AD_C is compressed may be easily identified, compared to the plurality of panel pads IPD_DP arranged and spaced apart from each other by a fine pitch or spacing.

As shown in FIGS. 7 and 9, the plurality of first dummy output pads DPD_FB1 may overlap the panel alignment mark AM_DP in the third direction (Z). For example, the opposite end of each of the plurality of first dummy output pads DPD_FB1 may overlap the extension AM_DP_E of the panel alignment mark AM_DP in the third direction (Z). Accordingly, a size of a restoration force generation area BBR to be described later may be reduced.

As shown in FIGS. 7 and 10, when the connection circuit board FB is coupled to the display panel DP, the plurality of second dummy panel pads DPD_DP2 may overlap the plurality of second dummy output pads DPD_FB2, respectively. As described above, a length of the second dummy panel pad DPD_DP2 may be smaller than that of the panel pad IPD_DP, so that whether the plurality of panel pads IPD_DP and the plurality of output pads OPD_FB extending in the diagonal direction are aligned with each other may be easily identified.

Referring to FIGS. 7 to 10, the connection circuit board FB may further include the restoration force generation area BBR defined between the plurality of output pads OPD_FB and the plurality of dummy output pads DPD_FB.

The restoration force generation area BBR refers to an area of the connection circuit board FB where a restoration force that acts to restore the connection circuit board FB into an original flat shape after the connection circuit board FB is compressed and bent using the above-described tool during a process of compressing the connection circuit board FB toward the display panel DP. The restoration force generation area BBR may mean a specific area of the base film BSF.

In FIG. 5 to FIG. 10, the restoration force generation area BBR is conceptually illustrated. The restoration force generation area BBR is shown as a closed space to distinguish the area BBR from other areas in a plan view. However, the present disclosure is not necessarily limited thereto. The restoration force generation area BBR may further include an area adjacent to the illustrated closed space, or may mean a partial area disposed inside the closed space.

In FIG. 5 to FIG. 7, the restoration force generation area BBR may have an approximate rectangular shape. A portion thereof adjacent to the rectangular first dummy output pad DPD_FB1 may have a shape protruding toward the output pad OPD_FB. In one example, a size of the restoration force generation area BBR may be 18,600 $\mu m^2$ or smaller. However, the present disclosure is not necessarily limited thereto. The shape and the size of the restoration force generation area BBR may vary in various ways according to a design of the display device 1.

In a plan view, the restoration force generation area BBR may be mainly disposed between the plurality of output pads OPD_FB, the plurality of first dummy output pads DPD_FB, the second dummy output pad DPD_FB2, and the panel alignment mark AM_DP. In a plan view, at least a portion of the restoration force generation area BBR may be surrounded with the plurality of output pads OPD_FB, the plurality of first dummy output pads DPD_FB, the plurality of second dummy output pads DPD_FB2, and the third dummy output pad DPD_FB3. In a plan view, a portion of the restoration force generation area BBR adjacent to and disposed between the opposite end of the outermost second dummy output pad DPD_FB2 and an end of the second extension DPD_FB32 of the third dummy output pad DPD_FB3 may be opened and exposed toward an edge of the base film BSF. However, the present disclosure is not necessarily limited thereto. The restoration force generation area BBR may be entirely surrounded with the plurality of first dummy output pads DPD_FB, the second dummy output pad DPD_FB2 and the panel alignment mark AM_DP in a plan view.

The restoration force generation area BBR might not overlap the output pad OPD_FB, the first dummy output pad DPD_FB1, the second dummy output pad DPD_FB2, and the third dummy output pad DPD_FB3. For example, the restoration force generation area BBR may be an area in which the output pad OPD_FB, the first dummy output pad DPD_FB1, the second dummy output pad DPD_FB2, and the third dummy output pad DPD_FB3 are not disposed.

As shown in FIG. 7, FIG. 9, and FIG. 10, a portion of the first dummy output pad DPD_FB1 may overlap the panel alignment mark AM_DP in the third direction (Z). For example, the opposite end to one end of the first dummy output pad DPD_FB1 adjacent to the edge extending in the first direction (X) of the connection circuit board FB may overlap the panel alignment mark AM_DP in the third direction (Z).

The output pad OPD_FB, the second dummy output pad DPD_FB2, and the third dummy output pad DPD_FB3 might not overlap the panel alignment mark AM_DP in the third direction (Z). Accordingly, the protrusion AM_DP_P of the panel alignment mark AM_DP and the extension AM_DP_E adjacent thereto may be easily recognized. Further, as described above, the second extension DPD_FB32 of the third dummy output pad DPD_FB3 functions as an alignment mark, so that alignment between the connection circuit board FB and the display panel DP may be easily performed.

The restoration force generation area BBR may overlap, in a thickness direction of the device, with at least a portion of the panel alignment mark AM_DP. The restoration force generation area BBR may overlap, in the thickness direction, the protrusion AM_DP_P and a portion of the extension AM_DP_E of the panel alignment mark AM_DP. The protrusion AM_DP_P of the panel alignment mark AM_DP may be positioned in the restoration force generation area BBR in a plan view. The extension AM_DP_E of the panel alignment mark AM_DP may be positioned so that a portion thereof overlaps the restoration force generation area BBR in a plan view. A portion of the extension AM_DP_E of the panel alignment mark AM_DP that does not overlap the plurality of first dummy output pads DPD_FB1 may overlap the restoration force generation area BBR.

When the connection circuit board FB is attached to the display panel DP, a lift defect of the connection circuit board FB may occur due to the restoration force of the connection circuit board FB made of a flexible material. Air bubbles may be produced due to the lift defect. Thus, the display device 1 may be defective. In the display device 1, according to one implementation of the present disclosure, the arrangement of the panel pad IPD_DP, the dummy panel pad DPD_DP, the output pad OPD_FB and the dummy output pad DPD_FB may be appropriately adjusted such that the restoration force of the connection circuit board FB as described above may be reduced, and the protrusion AM_DP_P of the panel alignment mark AM_DP and the second extension DPD_FB32 of the third dummy output pad DPD_FB3 used for alignment between the display panel DP and the connection circuit board FB during the process may be easily recognized.

Figure 11:
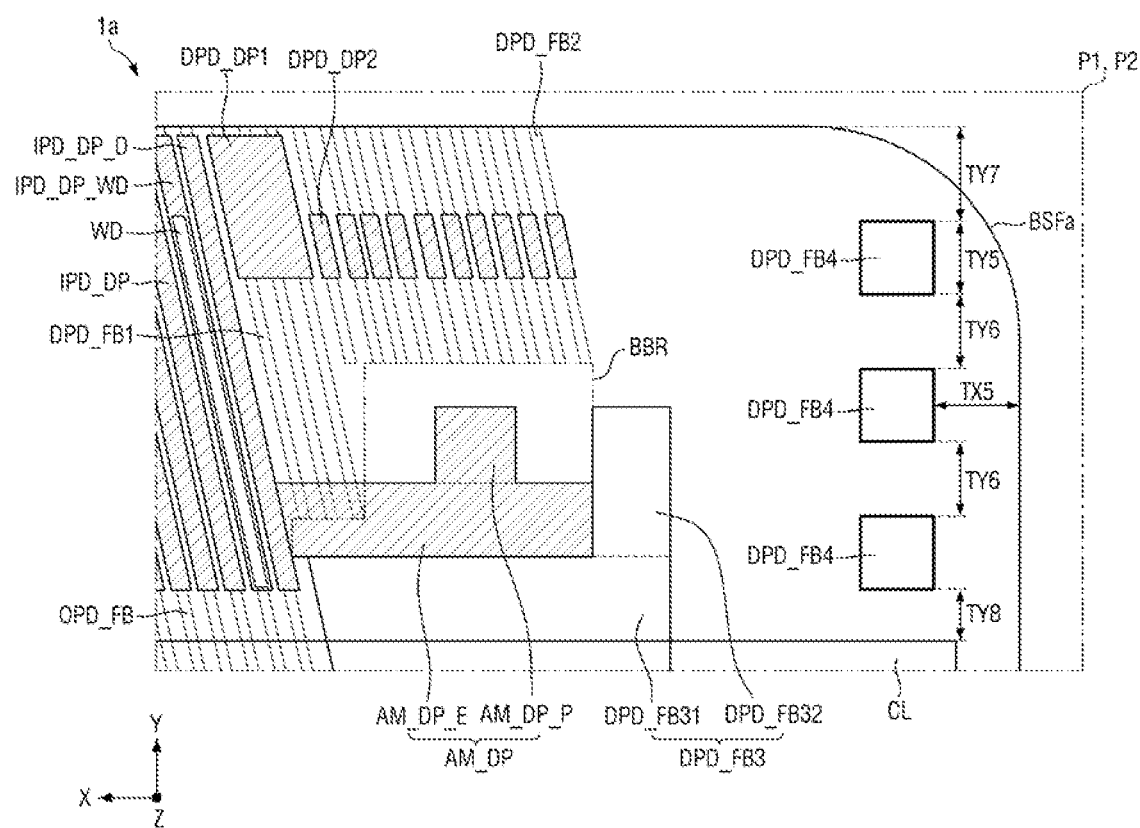
FIG. 11 is a plan view of 'P1' and 'P2' areas of a display device according to an implementation of the present disclosure.

FIG. 11 is a plan view of 'P1' and 'P2' areas of a display device according to an implementation of the present disclosure.

The implementation of the present disclosure of FIG. 11 is different from the implementation of the present disclosure of FIGS. 1 to 10 mainly in that the connection circuit board FB further includes a fourth dummy output pad DPD_FB4.

Referring to FIG. 11, the connection circuit board FB may further include a plurality of fourth dummy output pads DPD_FB4.

The plurality of fourth dummy output pads DPD_FB4 may be arranged from the corner area of the connection circuit board FB and along an edge extending in the second direction (Y) of the connection circuit board FB. The plurality of fourth dummy output pads DPD_FB4 may prevent overflow of the adhesive AD, and may maintain a gap between the connection circuit board FB and the display panel DP, and may increase an adhesive area of the adhesive AD. In one implementation of the present disclosure, three fourth dummy output pads DPD_FB4 are disposed in one corner area of the printed circuit board SUB overlapping the display panel DP and an area adjacent thereto. However, the number of the fourth dummy output pads DPD_FB4 is not necessarily limited to three.

Each of the plurality of fourth dummy output pads DPD_FB4 may have an approximate square shape in a plan view. One side of the fourth dummy output pad DPD_FB4 may have a sixth length TY5. The sixth length TY5 may be equal to the first length TX2, the fifth distance, or the fourth length TY4. In one example, the sixth length TY5 may be about 100 μm. However, the dimension and the shape of the fourth dummy output pad DPD_FB4 are not necessarily limited thereto. Each of the plurality of fourth dummy output pads DPD_FB4 may have various planar shapes, such as a rectangle, a polygon, a circle, or an ellipse. In one implementation of the present disclosure, all of the plurality of fourth dummy output pads DPD_FB4 may have the same size. However, the present disclosure is not necessarily limited thereto. At least one of the plurality of dummy output pads DPD_FB may have a size different from a size of the rest thereof.

The plurality of fourth dummy output pads DPD_FB4 may be spaced apart from an edge of the base film BSF extending in the second direction (Y). The plurality of fourth dummy output pads DPD_FB4 may be spaced apart from the edge of the base film BSF by an eighth distance TX5 in the first direction (X). The eighth distance TX5 may be equal to the sixth length TY5. In one example, the eighth distance TX5 may be about 100 μm. However, the present disclosure is not necessarily limited thereto.

The plurality of fourth dummy output pads DPD_FB4 may be arranged and spaced apart from each other by a constant spacing in the second direction (Y). The plurality of fourth dummy output pads DPD_FB4 may be arranged and spaced apart from each other by a ninth distance TX6 in the second direction (Y). The ninth distance TX6 may be equal to the sixth length TY5 or the eighth distance TX5. In one example, the ninth distance TX6 may be about 100 μm. However, the present disclosure is not necessarily limited thereto.

A fourth dummy output pad DPD_FB4 closest to the edge extending in the first direction (X) of the connection circuit board FB, among the plurality of fourth dummy output pads DPD_FB4, may be spaced apart from the edge of the connection circuit board FB by a tenth distance TY7 in the second direction (Y). The tenth distance TY7 may be greater than the eighth distance TX5 or the ninth distance TX6. In one example, the tenth distance TY7 may be about 200 μm. However, the present disclosure is not necessarily limited thereto.

A fourth dummy output pad DPD_FB4 closest to the coated layer CL among the plurality of fourth dummy output pads DPD_FB4 may be spaced apart from the coated layer CL by an eleventh distance TY8 in the second direction (Y). The eleventh distance TY8 may be smaller than the tenth distance TY7, and may be greater than the ninth distance TX6. In one example, the eleventh distance TY8 may be 160 μm. However, the present disclosure is not necessarily limited thereto.

The plurality of fourth dummy output pads DPD_FB4 may be spaced apart from the third dummy output pad DPD_FB3 in the first direction (X). In one example, the plurality of fourth dummy output pads DPD_FB4 may be spaced apart from the third dummy output pad DPD_FB3 by a spacing greater than or equal to the eighth distance TX5 in the first direction (X). However, the present disclosure is not necessarily limited thereto.

At least some of the plurality of fourth dummy output pads DPD_FB4 may overlap the restoration force generation area BBR in first direction (X) in a plan view. As shown in FIG. 11, a fourth dummy output pad DPD_FB4 adjacent to an edge of the corner area of the base film BSF does not overlap, in the first direction (X), with the restoration force generation area BBR. At least some of the fourth dummy output pads DPD_FB4 adjacent to the edge extending in the second direction (Y) of the base film BSF may overlap the restoration force generation area BBR in the first direction (X).

An edge of the corner area of the base film BSF may have a smaller curvature than that in the implementation of the present disclosure of FIG. 1 to FIG. 10. The radius of curvature of the corner area of the base film BSF may be greater than the eighth distance TX5, the ninth distance TX6, and the eleventh distance TY8. The radius of curvature of the corner area of the base film BSF may be equal to the tenth distance TY7. In one example, the corner area of the base film BSF may have a radius of curvature of about 0.2 mm. However, the present disclosure is not necessarily limited thereto.

As the curvature of the corner area of the base film BSF decreases, a dimension in the first direction (X) of the base film BSF may decrease. In one example, the dimension in the first direction (X) of the base film BSF may be about 60.8 mm. However, the present disclosure is not necessarily limited thereto.

The implementation of the present disclosure of FIG. 11I is substantially the same as or similar to the implementation of the present disclosure of FIGS. 1 to 10, except that the base film BSF further includes the plurality of fourth dummy output pads DPD_FB4. Thus, to the extent that a detailed description of elements are omitted, it may be assumed that these elements are at least similar to corresponding elements that have been described in detail herein.

Figure 12:
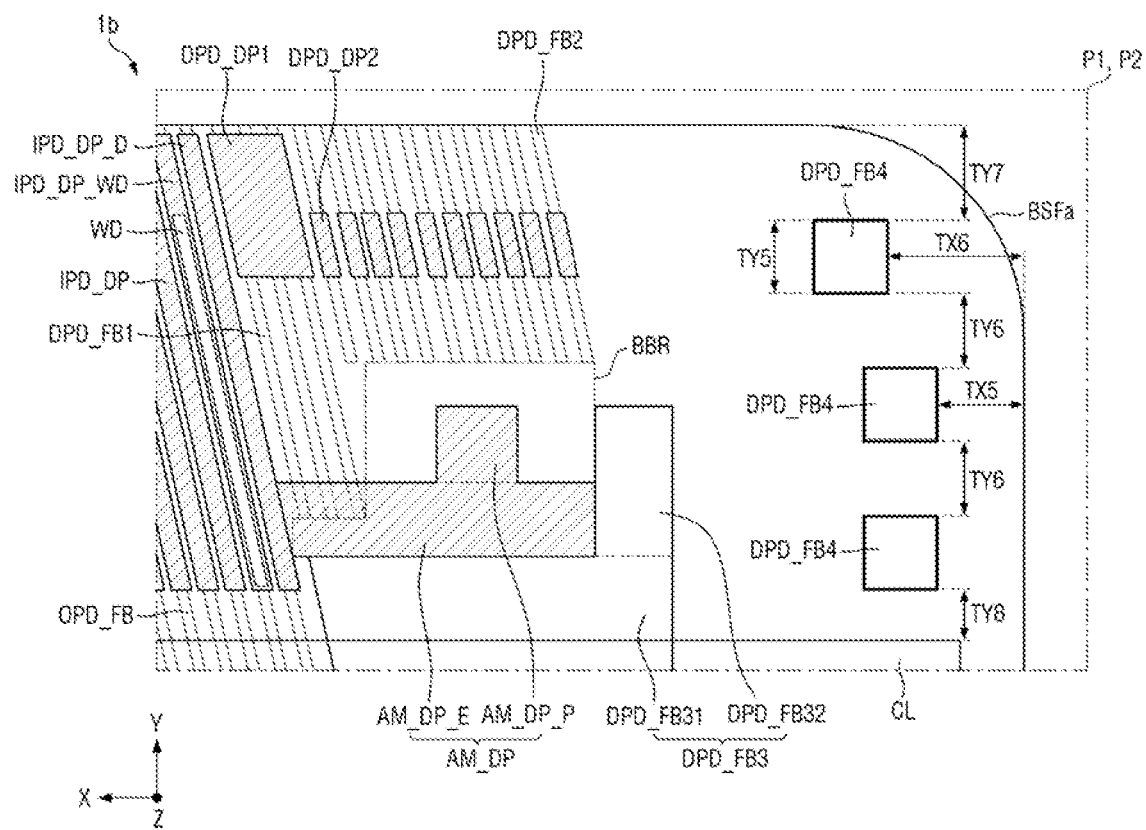
FIG. 12 is a plan view of 'P1' and 'P2' areas of a display device according to an implementation of the present disclosure.

FIG. 12 is a plan view of 'P1' and 'P2' areas of a display device 1 according to an implementation of the present disclosure.

The implementation of the present disclosure of FIG. 12 is different from the implementation of the present disclosure of FIG. 11I mainly in terms of an arrangement of the plurality of fourth dummy output pads DPD_FB4.

Referring to FIG. 12, as described above, the connection circuit board FB may further include the plurality of fourth dummy output pads DPD_FB4.

Unlike the implementation of the present disclosure of FIG. 11, a spacing between a fourth dummy output pad DPD_FB4 disposed in the corner area among the plurality of fourth dummy output pads DPD_FB4 and an edge extending in the second direction (Y) of the connection circuit board FB may be different from a spacing between the remaining fourth dummy output pads DPD_FB4 and the edge extending in the second direction (Y) of the connection circuit board FB.

A spacing between the fourth dummy output pad DPD_FB4 disposed in the corner area among the plurality of fourth dummy output pads DPD_FB4 and an edge extending in the first direction (X) of the connection circuit board FB may be smaller than spacings between the remaining fourth dummy output pads DPD_FB4 and the edge extending in the first direction (X) of the connection circuit board FB. Further, the spacing between the fourth dummy output pad DPD_FB4 disposed in the corner area among the plurality of fourth dummy output pads DPD_FB4 and an edge extending in the second direction (Y) of the connection circuit board FB may be larger than the spacing between the remaining fourth dummy output pads DPD_FB4 and the edge extending in the second direction (Y) of the connection circuit board FB. Thus, the flow phenomenon of the adhesive AD in the second direction (Y) may be reduced, and adhesion of the corner area of the connection circuit board FB may be enhanced, and damage to the fourth dummy output pad DPD_FB4 due to a process error in the corner area of the base film BSF may be prevented.

At least a portion of the fourth dummy output pad DPD_FB4 disposed in the corner area may overlap an edge having a curvature of the corner area of the connection circuit board FB in the first direction (X) and the second direction (Y). A portion of the fourth dummy output pad DPD_FB4 disposed in the corner area may overlap the remaining fourth dummy output pads DPD_FB4 in the second direction (Y). In this case, the remaining fourth dummy output pads DPD_FB4 may entirely overlap each other in the second direction (Y). However, the present disclosure is not necessarily limited thereto. A portion of the fourth dummy output pad DPD_FB4 disposed in the corner area might not overlap the remaining fourth dummy output pads DPD_FB4 in the second direction (Y).

The fourth dummy output pad DPD_FB4 disposed in the corner area may be spaced apart from the edge extending in the first direction (X) of the connection circuit board FB by the tenth distance TY7 in the second direction (Y).

The fourth dummy output pad DPD_FB4 disposed in the corner area may be spaced apart from the edge extending in the second direction (Y) of the connection circuit board FB by a twelfth distance TX6 in the first direction (X). The twelfth distance TX6 may be greater than the eighth distance TX5 or the ninth distance TX6. The twelfth distance TX6 may be smaller than the tenth distance TY7. The twelfth distance TX6 may be smaller than or equal to the eleventh distance TY8. In one example, the twelfth distance TX6 may be about 150 μm. However, the present disclosure is not necessarily limited thereto.

The implementation of the present disclosure of FIG. 12 is substantially the same as or similar to the implementation of the present disclosure of FIG. 11I except for the arrangement of the plurality of fourth dummy output pads DPD_FB4. Thus, to the extent that a detailed description of elements are omitted, it may be assumed that these elements are at least similar to corresponding elements that have been described in detail herein.

Figure 13:
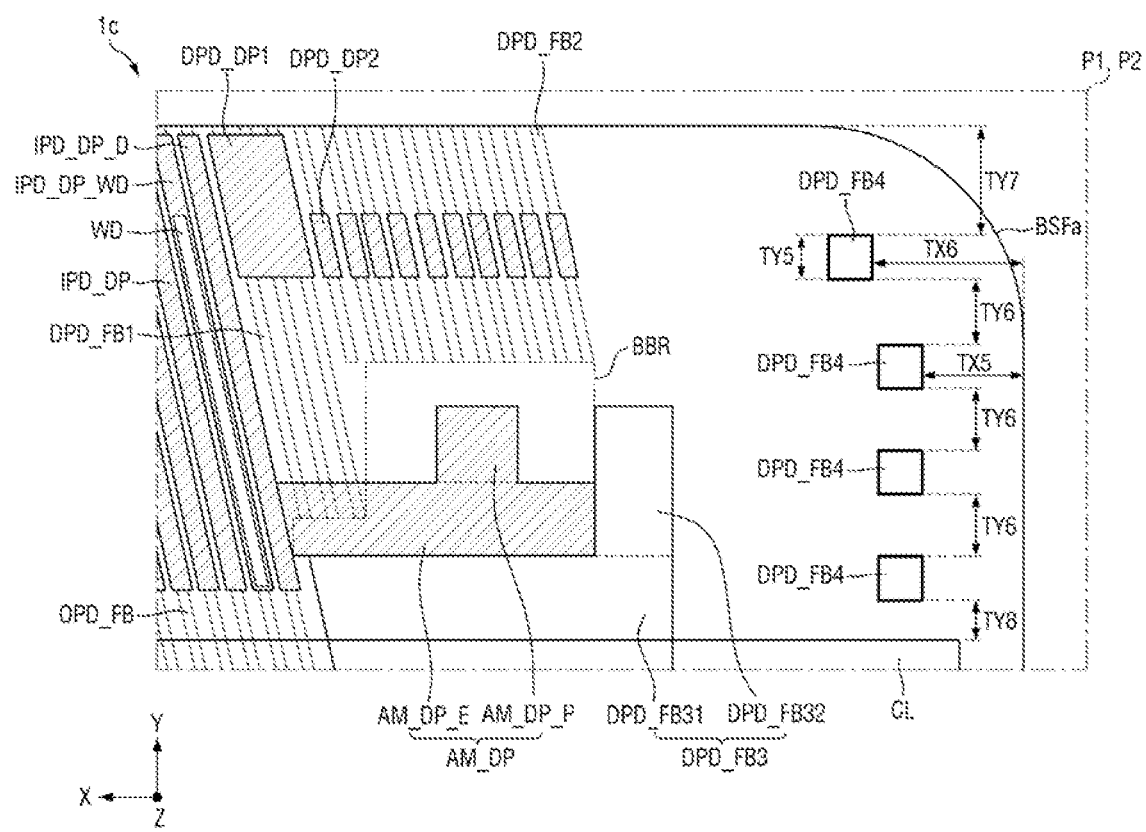
FIG. 13 is a plan view of 'P1' and 'P2' areas of a display device according to an implementation of the present disclosure.

FIG. 13 is a plan view of 'P1' and 'P2' areas of a display device according to an implementation of the present disclosure.

The implementation of the present disclosure of FIG. 13 is different from the implementation of the present disclosure of FIG. 12 mainly in terms of a size and the number of the plurality of fourth dummy output pads DPD_FB4.

Referring to FIG. 13, four fourth dummy output pads DPD_FB4 may be disposed in one corner area of the connection circuit board FB overlapping with the display panel DP and an area adjacent thereto. However, the number of the fourth dummy output pads DPD_FB4 is not necessarily limited thereto. Five or more fourth dummy output pads DPD_FB4 may be disposed therein.

The sixth length TY5 of one side of each of the plurality of fourth dummy output pads DPD_FB4 may be smaller than the ninth distance TX6. As described above, the ninth distance TX6 may be equal to the first length TX2, the fifth distance, the fourth length TY4, or the eighth distance TX5. In one example, the sixth length TY5 may be about ½ of the ninth length. In an example, the sixth length TY5 may be about 50 μm. However, the present disclosure is not necessarily limited thereto.

The fourth dummy output pad DPD_FB4 may be spaced apart from the edge in the first direction (X) of the connection circuit board FB by the eighth distance TX5 or the twelfth distance TX6. The eighth distance TX5 and the twelfth distance TX6 are the same as described above in the implementation of the present disclosure of FIG. 12.

As the size of the fourth dummy output pad DPD_FB4 decreases, the dimension in the first direction (X) of the connection circuit board FB may be further reduced. In one example, the dimension in the first direction (X) of the connection circuit board FB may be about 60.7 mm. However, the present disclosure is not necessarily limited thereto.

As described above, the edge of the corner area of the base film BSF may be rounded to have a curvature in a plan view.

A fourth dummy output pad DPD_FB4 disposed in the corner area of the base film BSF among the plurality of fourth dummy output pads DPD_FB4 may overlap the edge of the base film BSF in the first direction (X) in a plan view. In this case, the number of the fourth dummy output pads DPD_FB4 disposed in the corner area of the base film BSF may be smaller than the number of the remaining fourth dummy output pad DPD_FB4. In FIG. 13, only one fourth dummy output pad DPD_FB4 overlaps the edge of the base film BSF in the first direction (X) in a plan view. However, the present disclosure is not necessarily limited thereto. Two or more fourth dummy output pads DPD_FB4 may be disposed in the corner area of the base film BSF, and overlap the edge of the base film BSF in the first direction (X).

The fourth dummy output pad DPD_FB4 disposed in the corner area of the base film BSF among the plurality of fourth dummy output pads DPD_FB4 might not overlap, in the second direction (Y), with the remaining fourth dummy output pads DPD_FB4 in a plan view. However, the present disclosure is not necessarily limited thereto. A portion of the fourth dummy output pad DPD_FB4 disposed in the corner area of the base film BSF among the plurality of fourth dummy output pads DPD_FB4 may overlap the remaining fourth dummy output pads DPD_FB4 in the second direction (Y) in a plan view.

The implementation of the present disclosure of FIG. 13 is substantially the same as or similar to the implementation of the present disclosure of FIG. 12 except for the size and the number of the plurality of fourth dummy output pads DPD_FB4. Thus, to the extent that a detailed description of elements are omitted, it may be assumed that these elements are at least similar to corresponding elements that have been described in detail herein.

Figure 14:
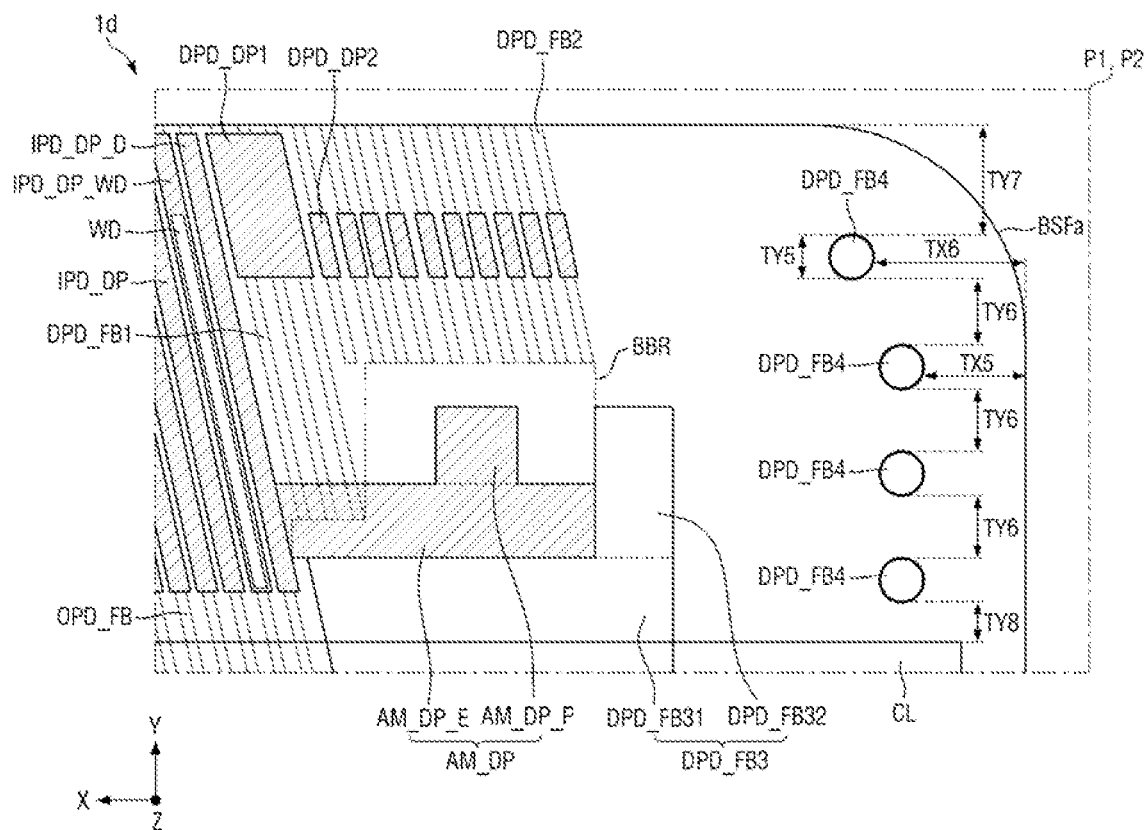
FIG. 14 is a plan view of 'P1' and 'P2' areas of a display device according to an implementation of the present disclosure.

FIG. 14 is a plan view of 'P1' and 'P2' areas of a display device according to an implementation of the present disclosure.

The implementation of the present disclosure of FIG. 14 is different from the implementation of the present disclosure of FIG. 13 mainly in terms of a shape of each of the plurality of fourth dummy output pads DPD_FB4.

Referring to FIG. 14, each of the plurality of fourth dummy output pads DPD_FB4 may have a circular planar shape. In this case, the sixth length TY5 may mean a diameter of the fourth dummy output pad DPD_FB4. However, the present disclosure is not necessarily limited thereto. The fourth dummy output pad DPD_FB4 may have an elliptical planar shape. As the planar shape of the fourth dummy output pad DPD_FB4 includes a curve, a dent damage due to a sharp corner when the connection circuit board FB and the display panel DP are compressed against each other may be minimized.

The implementation of the present disclosure of FIG. 14 is substantially the same as or similar to the implementation of the present disclosure of FIG. 13 except for the shape of each of the plurality of fourth dummy output pads DPD_FB4. Thus, to the extent that a detailed description of elements are omitted, it may be assumed that these elements are at least similar to corresponding elements that have been described in detail herein.

Referring to FIG. 1 to FIG. 14, the output pad OPD_FB or the input pad IPD_FB may input and/or output a signal. At least one of the output pad OPD_FB or the input pad IPD_FB may perform both a function of inputting a signal and a function of outputting a signal.

The output pad OPD_FB, the dummy output pad DPD_FB, the first dummy output pad DPD_FB1, the second dummy output pad DPD_FB2, the third dummy output pad DPD_FB3, and the fourth dummy output pad DPD_FB4 of the connection circuit board FB may be respectively referred to as a pad, a dummy pad, a first dummy pad, a second dummy pad, a third dummy pad, and a fourth dummy pad. However, the naming is exemplary. The present disclosure is not necessarily limited thereto.

Although various embodiments of the present invention have been disclosed for illustrative purposes, those skilled in the art will appreciate that various modifications, additions and substitutions are possible, without departing from the scope and spirit of present disclosure.

What is claimed is:

1. A display device, comprising:
   a display panel including a plurality of panel pads, and a panel alignment mark adjacent to the plurality of panel pads;
   a connection circuit board connected to the display panel, wherein the connection circuit board includes a plurality of input/output pads and a plurality of dummy pads adjacent to the plurality of input/output pads,
   wherein at least some of the plurality of dummy pads at least partially overlap the panel alignment mark in a thickness direction of the display device.

2. The device of claim 1, wherein the plurality of dummy pads include:
   a plurality of first dummy pads extending in parallel to the plurality of input/output pads; and
   a plurality of second dummy pads extending in parallel to the plurality of input/output pads, wherein each of the plurality of second dummy pads has a length smaller than a length of each of the plurality of first dummy pads,
   wherein at least some of the plurality of first dummy pads is disposed between the plurality of input/output pads and at least some of the plurality of second dummy pads.

3. The device of claim 2, wherein the plurality of first dummy pads overlap the panel alignment mark in the thickness direction,
   wherein the plurality of second dummy pads does not overlap the panel alignment mark in the thickness direction.

4. The device of claim 3, wherein the panel alignment mark includes an extension portion extending in a first direction, and a protrusion portion extending from the extension portion in a second direction intersecting the first direction,
   wherein the plurality of first dummy pads overlap the extension portion of the panel alignment mark the in the thickness direction.

5. The device of claim 4, wherein the plurality of first dummy pads and the plurality of second dummy pads do not overlap the protrusion portion of the panel alignment mark in the thickness direction.

6. The device of claim 3, wherein the plurality of dummy pads further includes a third dummy pad which does not overlap the panel alignment mark in a plan view.

7. The device of claim 6, wherein the third dummy pad includes a first extension portion extending in a first direction, and a second extension portion extending from the first extension portion in a second direction intersecting the first direction, wherein an end of the second extension portion protrudes beyond the panel alignment mark in the second direction.

8. The device of claim 7, wherein the first extension portion and the second extension portion surround a corner of the panel alignment mark in a plan view.

9. The device of claim 6, wherein the connection circuit board includes a restoration force generation area proximate to the plurality of input/output pads, the plurality of first dummy pads, the plurality of second dummy pads, and the third dummy pad in a plan view.

10. The device of claim 9, wherein the restoration force generation area does not overlap the plurality of input/output pads, the plurality of first dummy pads, the plurality of second dummy pads, and the third dummy pad in the thickness direction, and
wherein the restoration force generation area overlaps the panel alignment mark in the thickness direction.

11. The device of claim 10, wherein the panel alignment mark includes an extension portion extending in a first direction, and a protrusion portion extending from the extension portion in a second direction intersecting the first direction,
wherein the restoration force generation area overlaps the protrusion portion of the panel alignment mark in the thickness direction.

12. The device of claim 3, wherein the plurality of dummy pads further includes a plurality of third dummy pads, wherein the plurality of third dummy pads is disposed closer to an edge of the connection circuit board than the plurality of second dummy pads is to the edge of the connection circuit board.

13. The device of claim 12, wherein the plurality of third dummy pads is arranged along a direction in which the edge of the connection circuit board extends.

14. The device of claim 12, wherein a distance between a third dummy pad closest to a corner area of the connection circuit board among the plurality of third dummy pads and the edge of the connection circuit board is larger than a distance between each of remaining third dummy pads of the plurality of third dummy pads, other than the third dummy pad closest to the corner area, and the edge of the connection circuit board.

15. The device of claim 1, wherein the display panel includes an active area in which a plurality of pixels are disposed,
wherein the plurality of panel pads include:
a first panel pad electrically connected to the active area;
a second panel pad insulated from the active area and including a window; and
a third panel pad as an outermost panel pad among the plurality of panel pads, wherein the third panel pad is electrically insulated from the active area.

16. The device of claim 1, wherein the display panel includes:
a first dummy panel pad extending in parallel to the plurality of panel pads; and
a plurality of second dummy panel pads, wherein each of the plurality of second dummy panel pads extends in parallel to the first dummy panel pad and has a length that is smaller than a length of the first dummy panel pad,
wherein a width of the first dummy panel pad is larger than a width of each of the plurality of second dummy panel pads.

17. The device of claim 1, wherein the device further comprises a main circuit board connected to the connection circuit board, and a driver mounted on the connection circuit board,
wherein the connection circuit board is flexible and bendable.

18. A display device, comprising:
a connection circuit board including a plurality of first dummy pads, and a plurality of second dummy pads, wherein each of the plurality of second dummy pads extends in parallel to each of the plurality of first dummy pads, and each of the plurality of second dummy pads has a length that is smaller than a length of each of the plurality of first dummy pads; and
a panel alignment mark at least partially overlapping the plurality of first dummy pads in a thickness direction of the display device.

19. The device of claim 18, wherein the panel alignment mark includes:
an extension portion extending in a first direction intersecting an extension direction of each of the plurality of first dummy pads, wherein the extension portion overlaps the plurality of first dummy pads in the thickness direction; and
a protrusion portion protruding from the extension portion in a second direction intersecting the first direction and toward the plurality of second dummy pads, wherein the protrusion portion does not overlap either the plurality of first dummy pads or the plurality of second dummy pads in the thickness direction.

20. The device of claim 19, wherein the connection circuit board includes a third dummy pad protruding from the extension portion in the second direction in a plan view.

21. An electronic device, comprising:
a display panel including a panel alignment mark; and
a connection circuit board connected to the display panel including a plurality of connection pads and a plurality of dummy pads,
wherein at least one connection pad of the plurality of connection pads overlaps the panel alignment mark.

22. The electronic device of claim 21, wherein the display panel further includes a plurality of panel pads proximate to the panel alignment mark.

23. The electronic device of claim 21, wherein the plurality of connection pads includes a plurality of input/output pads adjacent to the plurality of dummy pads.

24. The electronic device of claim 21, wherein each of the plurality of dummy pads extend in parallel to each of the plurality of connection pads.

25. The electronic device of claim 24, wherein a first group of dummy pads of the plurality of dummy pads each have a first length, and a second group of dummy pads of the plurality of dummy pads has a second length that is smaller than the first length.

26. The electronic device of claim 25, wherein the at least one connection pad of the plurality of connection pads that overlaps the panel alignment mark is one of the first group of dummy pads of the plurality of dummy pads.

* * * * *